United States Patent
Ahn et al.

(10) Patent No.: US 10,689,511 B2
(45) Date of Patent: Jun. 23, 2020

(54) COMPOSITIONS, COMPOSITES PREPARED THEREFROM, AND ELECTRONIC DEVICES INCLUDING THE SAME

(71) Applicants: SAMSUNG ELECTRONICS CO., LTD., Suwon-si, Gyeonggi-do (KR); Samsung Display Co., Ltd., Yongin-si, Gyeonggi-do (KR); SAMSUNG SDI CO., LTD., Yongin-si, Gyeonggi-do (KR)

(72) Inventors: Jooyeon Ahn, Suwon-si (KR); Nayoun Won, Suwon-si (KR); Ha Il Kwon, Suwon-si (KR); Eun Joo Jang, Suwon-si (KR); Shin Ae Jun, Seongnam-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 107 days.

(21) Appl. No.: 15/862,197

(22) Filed: Jan. 4, 2018

(65) Prior Publication Data

US 2018/0186998 A1    Jul. 5, 2018

(30) Foreign Application Priority Data

Jan. 4, 2017    (KR) .................. 10-2017-0001579

(51) Int. Cl.
*C08L 57/10* (2006.01)
*C08L 53/00* (2006.01)
(Continued)

(52) U.S. Cl.
CPC ............ *C08L 57/10* (2013.01); *C08F 220/06* (2013.01); *C08F 222/1006* (2013.01);
(Continued)

(58) Field of Classification Search
CPC .......... C08L 81/02; C08L 53/00; C08L 57/10; C09D 181/02; C09J 181/02; C08K 5/09;
(Continued)

(56) References Cited

U.S. PATENT DOCUMENTS 7,329,369 B2    2/2008    Sato et al.
9,202,997 B2    12/2015    Jang et al.
(Continued)

FOREIGN PATENT DOCUMENTS

JP    2011231141 A    11/2011
JP    4928775 B2    2/2012
(Continued)

OTHER PUBLICATIONS

Partial machine translation of P-2015025092-A.*

*Primary Examiner* — Kregg T Brooks
(74) *Attorney, Agent, or Firm* — Cantor Colburn LLP

(57) ABSTRACT

A composition including: a plurality of quantum dots; a monomer combination including a first monomer having at least two thiol groups at terminal ends of the first monomer and a second monomer having at least two carbon-carbon double bonds at terminal ends of the second monomer; and an additive, a composite prepared therefrom, and an electronic device including same are disclosed. The additive includes a cyclosiloxane compound having a reactive moiety, a (meth)acrylate salt of a polyvalent metal, and a dithiocarbamate salt of a polyvalent metal, or a combination thereof, and wherein the reactive moiety includes a carbon-carbon double bond, a thiol group, or a combination thereof.

20 Claims, 6 Drawing Sheets

Repeating the Patterning Process three times

(51) Int. Cl.

| | | |
|---|---|---|
| *C08K 5/5419* | (2006.01) | |
| *C08K 5/09* | (2006.01) | |
| *C09K 11/08* | (2006.01) | |
| *C08K 5/205* | (2006.01) | |
| *C08K 3/013* | (2018.01) | |
| *C08F 222/10* | (2006.01) | |
| *H01L 33/50* | (2010.01) | |
| *C08F 220/06* | (2006.01) | |
| *C08L 81/02* | (2006.01) | |
| *C08G 75/045* | (2016.01) | |
| *C08K 5/098* | (2006.01) | |
| *C08K 5/39* | (2006.01) | |
| *C08K 5/5435* | (2006.01) | |

(52) U.S. Cl.
CPC ............ *C08G 75/045* (2013.01); *C08K 3/013* (2018.01); *C08K 5/09* (2013.01); *C08K 5/098* (2013.01); *C08K 5/205* (2013.01); *C08K 5/39* (2013.01); *C08K 5/5419* (2013.01); *C08K 5/5435* (2013.01); *C08L 53/00* (2013.01); *C08L 81/02* (2013.01); *C09K 11/08* (2013.01); *H01L 33/501* (2013.01); *C08L 2203/20* (2013.01); *C08L 2207/53* (2013.01); *H01L 33/502* (2013.01)

(58) Field of Classification Search
CPC ........ C08K 5/098; C08K 5/5435; C08K 5/39; C08G 75/045
See application file for complete search history.

(56) References Cited

U.S. PATENT DOCUMENTS

| | | | |
|---|---|---|---|
| 2005/0032927 A1* | 2/2005 | Itai | ........................ C08F 220/18 |
| | | | 522/182 |
| 2011/0068321 A1 | 3/2011 | Pickett et al. | |
| 2012/0001217 A1 | 1/2012 | Kang et al. | |
| 2012/0293063 A1* | 11/2012 | Kang | .................... C09K 11/02 |
| | | | 313/502 |
| 2014/0369024 A1* | 12/2014 | Xu | ............................ C08F 2/44 |
| | | | 362/84 |
| 2015/0083970 A1 | 1/2015 | Kim et al. | |

FOREIGN PATENT DOCUMENTS

| | | | |
|---|---|---|---|
| JP | 2015025092 A | * | 2/2015 |
| KR | 101107488 B1 | | 1/2012 |
| KR | 1020120054721 A | | 5/2012 |
| KR | 1020130046881 A | | 5/2013 |
| KR | 1020150034013 A | | 4/2015 |
| KR | 101553045 B1 | | 9/2015 |

\* cited by examiner

FIG. 1
Pattern Preparation by using a photoresist
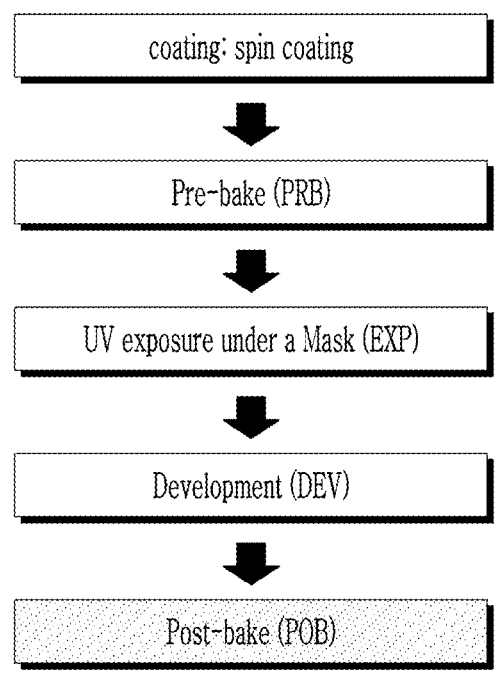
Repeating the Patterning Process three times

COMPOSITIONS, COMPOSITES PREPARED THEREFROM, AND ELECTRONIC DEVICES INCLUDING THE SAME

CROSS-REFERENCE TO RELATED APPLICATION

This application claims priority to Korean Patent Application No. 10-2017-0001579 filed in the Korean Intellectual Property Office on Jan. 4, 2017, and all the benefits accruing therefrom under 35 U.S.C. § 119, the content of which is incorporated herein in its entirety by reference.

BACKGROUND

1. Field

A composition, a composite prepared therefrom, and an electronic device including the same are disclosed.

2. Description of the Related Art

Quantum dots (e.g., nano-sized semiconductor nanocrystals) having different energy bandgaps may be obtained by controlling their sizes and compositions. Such quantum dots may emit light having various wavelengths.

SUMMARY

Some embodiments are related to a composition capable of realizing enhanced stability and a quantum dot polymer composite that may be prepared from the composition.

Embodiments are related to an electronic device including the quantum dot polymer composite.

In some embodiments, a composition includes a plurality of quantum dots;
a monomer combination including a first monomer having at least two thiol groups at its end terminals and a second monomer having at least two carbon-carbon double bonds at its end terminals; and an additive,
wherein the additive includes a cyclosiloxane compound having a reactive moiety, a (meth)acrylate salt of a polyvalent metal, a dithiocarbamate salt of a polyvalent metal, or a combination thereof, and
wherein the reactive moiety includes a carbon-carbon double bond, a thiol group, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

The first monomer may include a compound represented by Chemical Formula 1:

Chemical Formula 1

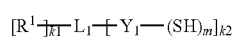

wherein, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a combination thereof, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The second monomer may include a compound represented by Chemical Formula 2.

Chemical Formula 2

wherein,

X is a C2 to C30 aliphatic organic group including a carbon-carbon double bond, a C6 to C30 aromatic organic group including a carbon-carbon double bond, or a C3 to C30 alicyclic organic group including a carbon-carbon double bond;

$R^2$ is hydrogen, a substituted or unsubstituted C1 to C30 straight or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C30 alkoxy group, a hydroxy group, —NH$_2$, a substituted or unsubstituted C1 to C30 amine group of formula —NRR' wherein R and R' are the same or different, and are each independently hydrogen or a C1 to C30 alkyl group, an isocyanate group, a halogen, —ROR' wherein R is a substituted or unsubstituted C1 to C20 alkylene group and R' is hydrogen or a C1 to C20 straight or branched alkyl group, an acyl halide of formula —RC(=O)X wherein R is a substituted or unsubstituted alkylene group and X is a halogen, —C(=O)OR' wherein R' is hydrogen or a C1 to C20 straight or branched alkyl group, —CN, or —C(=O)ONRR' wherein R and R' are the same or different, and are each independently hydrogen or a C1 to C20 straight or branched alkyl group;

L$_2$ is a carbon atom, a substituted or unsubstituted C1 to C30 alkylene group, a substituted or unsubstituted C2 to C30 alkylene group wherein at least one methylene (—CH$_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a combination thereof;

Y$_2$ is a single bond, a substituted or unsubstituted C1 to C30 alkylene group, or a substituted or unsubstituted C2 to C30 alkenylene group; or a C2 to C30 alkylene group or a C3 to C30 alkenylene group wherein at least one methylene group is replaced by a sulfonyl (—SO$_2$—), a carbonyl (—O(=O)—), an ether (—O—), a sulfide (—S—), a sulfoxide (—SO—), an ester (—O(=O)O—), an amide of formula —O(=O)NR— wherein R is hydrogen or a C1 to C10 alkyl group, an imine of formula —NR— wherein R is hydrogen or a C1 to C10 alkyl group, or a combination thereof;

n is an integer of 1 or more;
k3 is an integer of 0 or 1 or more;
k4 is an integer of 1 or more;
the sum of n and k4 is an integer of 3 or more;
n does not exceed the valance of Y$_2$; and
k3 and k4 does not exceed the valence of the L$_2$.

The first monomer may include a compound represented by Chemical Formula 1-1:

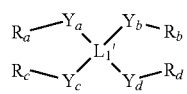

Chemical Formula 1-1 wherein

L$_1$' is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, a substituted or unsubstituted C3 to C30 heterocycloalkylene group, or a combination thereof;

each of Y$_a$ to Y$_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of R$_a$ to R$_d$ is R$^1$ of Chemical Formula 1 or SH, provided that at least two of R$_a$ to R$_d$ are SH.

The first monomer may include ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

The X moiety in Chemical Formula 2 may include an acrylate group, a methacrylate group, a C2 to C30 alkenyl group, a C3 to C30 alicyclic group substituted with a C2 to C30 alkenyl group, or a C3 to C30 heterocycloalkyl group substituted with a C2 to C30 alkenyl group, or a combination thereof.

The second monomer may include a compound represented by Chemical Formulae 2-1, Chemical Formula 2-2, or Chemical Formula 2-3.

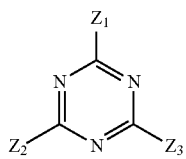

Chemical Formula 2-1

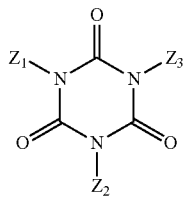

Chemical Formula 2-2 wherein, Z$_1$ to Z$_3$ are the same or different, and each independently correspond to —[Y$_2$—X$_n$] of Chemical Formula 2,

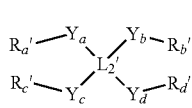

Chemical Formula 2-3

L$_2$' is carbon, a substituted or unsubstituted C1 to C20 alkylene group, a substituted or unsubstituted C2 to C20 alkenylene group, a C2 to C30 alkylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a'$ to $R_d'$ is $R^2$ or X defined in Chemical Formula 2, provided that at least two of $R_a'$ to $R_d'$ are X defined in Chemical Formula 2.

The cyclosiloxane compound may include a compound represented by Chemical Formula 3:

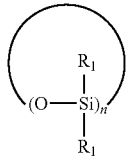

Chemical Formula 3 wherein n is an integer of about 3 to about 10, $R_1$ is the same or different and is each independently hydrogen, a C1 to C10 alkyl group, a C1 to C10 mercaptoalkyl group, a C1 to C10 alkoxy group, or -L-(CR$_2$)$_m$—CR=CR$_2$ (where L is a single bond or —O—, m is 0 to 16, R is each independently hydrogen or methyl) provided that at least one of $R_1$ is a C1 to C10 mercaptoalkyl group, -L-(CR$_2$)$_m$—CR=CR$_2$ (where L is a single bond or —O—, m is 0 to 16, R is each independently hydrogen or methyl), or a combination thereof.

The cyclosiloxane compound may have three or four —SiO— units and at least three reactive moieties including a carbon-carbon double bond or a thiol group.

The cyclosiloxane compound may include 2,4,6-trivinyl-2,4,6-trimethyl cyclotrisiloxane, 2,4,6,8-tetramethyl-2,4,6,8-tetravinyl cyclotetrasiloxane, or a combination thereof.

The (meth)acrylate salt of the polyvalent metal may include a compound represented by Chemical Formula 4:

 Chemical Formula 4 where M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and is each independently hydrogen, a substituted or unsubstituted C1 to C10 alkyl, or a combination thereof.

The dithiocarbamate salt of the polyvalent metal may include a compound represented by Chemical Formula 5:

M[SCSNR$_2$]$_n$       Chemical Formula 5 where M is a polyvalent metal including Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and is each independently hydrogen, a substituted or unsubstituted C1 to C10 alkyl group, a substituted or unsubstituted C3 to C20 cycloalkyl group, a substituted or unsubstituted C6 to C20 aryl group, or a combination thereof.

An amount of the additive may be greater than or equal to about 0.001 parts by weight and less than or equal to about 50 parts by weight per 100 parts by weight of the monomer combination.

The first monomer and the second monomer may be included in the monomer combination in such an amount that an amount of the carbon-carbon double bond is 0.1 moles to 20 moles per one mole of the thiol moiety.

In embodiments, a quantum dot polymer composite includes a polymer matrix and a plurality of quantum dots disposed (e.g., dispersed) in the polymer matrix, wherein the polymer matrix includes a polymerization product of a monomer combination including a first monomer having at least two thiol groups at its end terminals and a second monomer having at least two carbon-carbon double bonds at its end terminals; and an additive moiety, wherein the additive moiety includes a cyclosiloxane moiety, a (meth)acrylate salt of a polyvalent metal, and a dithiocarbamate salt of a polyvalent metal, or a combination thereof.

The first monomer may include a compound represented by Chemical Formula 1:

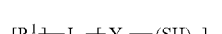 Chemical Formula 1 wherein $R^1$, $L_1$, $Y_1$, m, k1, and k2 are the same as defined above.

The second monomer may include a compound represented by Chemical Formula 2.

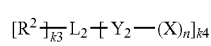 Chemical Formula 2 wherein X, $R^2$, $L_2$, $Y_2$, n, k3, and k4 are the same as defined above.

The polymer matrix may include a substituted or unsubstituted cyclotrisiloxane moiety, a substituted or unsubstituted cyclotetrasiloxane moiety, a substituted or unsubstituted cyclopentasiloxane moiety, a substituted or unsubstituted cyclohexasiloxane moiety, or a combination thereof.

The polymer matrix may include a moiety of a (meth)acrylate salt represented by Chemical Formula 4, a moiety of an alkyldithiocarbmate salt represented by Chemical Formula 5, or a combination thereof:

 Chemical Formula 4 where M, n, and R are the same as defined above.

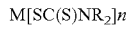 Chemical Formula 5 where M, n, and R are the same as defined above.

The amount of the additive moiety may be greater than or equal to about 0.001 wt % to about 40 wt % based on a total weight of the composite.

The quantum dot polymer composite may be in a form of a population of particles having an average particle size of less than or equal to about 10 μm.

In embodiments, a photosensitive composition includes the aforementioned quantum dot polymer composite, a carboxylic acid group containing polymer, a photopolymerizable monomer; and a photoinitiator.

The photosensitive composition may further include a solvent.

The carboxylic acid group containing binder polymer may have an acid value of greater than or equal to about 50 milligrams of KOH per gram of the polymer (mg KOH/g). The carboxylic acid group containing binder polymer may have an acid value of less than or equal to about 250 mg KOH/g.

Embodiments provide an electronic device including the quantum dot polymer composite.

The electronic devices may include a light emitting diode, an organic light emitting diode, a sensor, an imaging sensor, a solar cell device, or a liquid crystal display device.

The compositions of the foregoing embodiments may produce a quantum dot polymer composite having enhanced stability (e.g., heat stability). In addition, the composition may provide a quantum dot polymer composite with a desired form via a relatively simple process.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic diagram illustrating an exemplary embodiment of a method producing a quantum dot polymer composite pattern using a composition;

DETAILED DESCRIPTION

Figure 2:
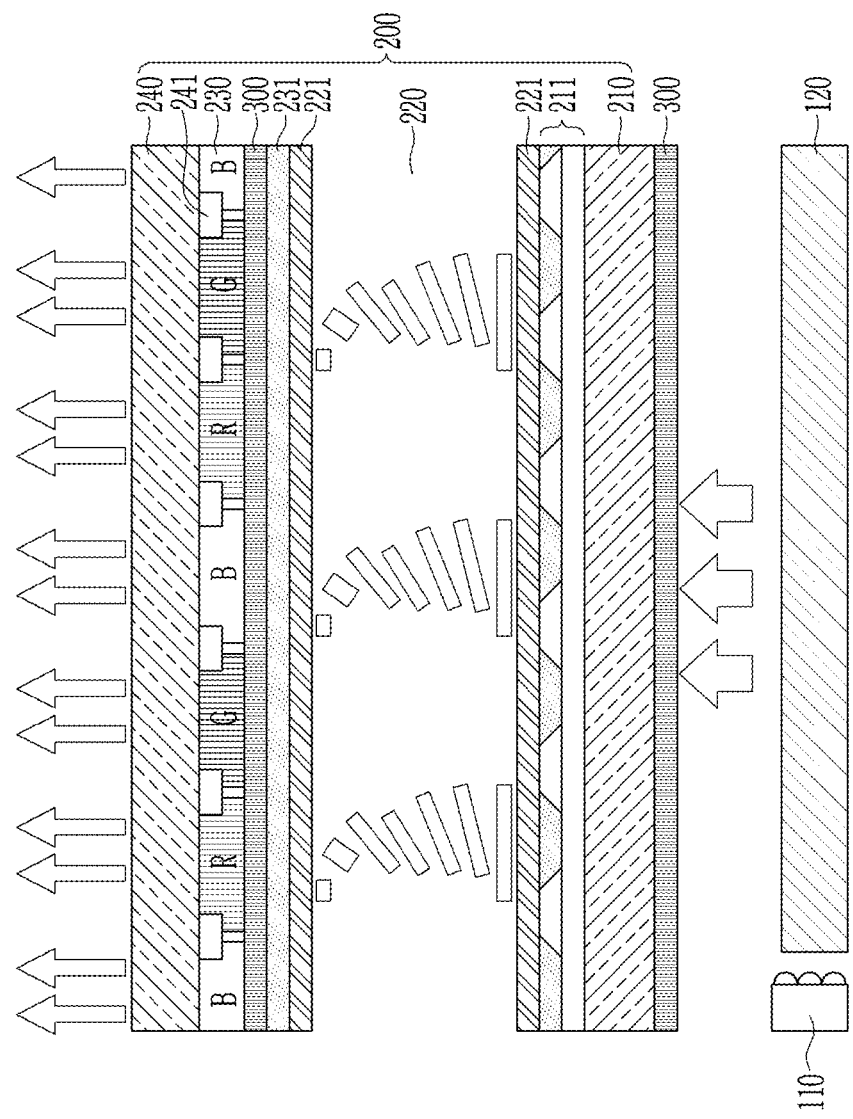
FIG. 2 is a cross-sectional view of an exemplary embodiment of an electronic device.

Advantages and characteristics of this disclosure, and a method for achieving the same, will become apparent referring to the following example embodiments together with the drawings attached hereto. However, the embodiments should not be construed as being limited to the embodiments set forth herein.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The terms defined in a generally-used dictionary may not be interpreted ideally or exaggeratedly unless clearly defined.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

It will be understood that when an element is referred to as being "on" another element, it may be directly on the other element or intervening elements may be present therebetween. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Combination" as used herein is inclusive of all types of combinations, including blends, alloys, solutions, and the like.

Further, the singular includes the plural unless mentioned otherwise.

In the drawings, the thickness of layers, films, panels, regions, etc., are exaggerated for clarity. Like reference numerals designate like elements throughout the specification.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, when a definition is not otherwise provided, the term "substituted" refers to a compound or a group or a moiety wherein at least one of hydrogen atoms thereof is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents. As used herein, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, when a definition is not otherwise provided, the term "mercaptoalkyl group" refers to an alkyl group terminated by a thiol (—SH) group, i.e., a group of the formula —RSH wherein R is the alkyl or alkylene group.

As used herein, when a definition is not otherwise provided, the term "(meth)acrylate" refers to acrylate and/or methacrylate.

Luminous properties and stabilities of quantum dots may be susceptible to external environment/stimuli such as air, moisture, and heat. In order to be used in a device, the quantum dots may be mixed with (e.g., dispersed in) a solid state matrix (e.g., a polymer matrix) to form a quantum dot polymer composite. Preparation processes of such composites may have substantial and possibly adverse effects on the inherent properties of the quantum dots. Thus, there remains a need to develop a technique for preventing, inhibiting, or reducing deterioration of properties of the quantum dots due to the external stimuli applied thereto for the application thereof.

In an embodiment, a composition includes a plurality of quantum dots; a monomer combination including a first monomer having at least two thiol groups at its end terminals and a second monomer having at least two carbon-carbon double bonds at its end terminals; and an additive. The additive includes a cyclosiloxane compound having a reactive moiety, a (meth)acrylate salt of a polyvalent metal, and a dithiocarbamate (e.g., alkyldithiocarbamate or dialkyldithiocarbamate) salt of a polyvalent metal, or a combination thereof. The reactive moiety includes a carbon-carbon double bond, a thiol group, or a combination thereof.

As used herein, the term "dispersion" refers to a dispersion, wherein a dispersed phase is a solid and a continuous phase includes a liquid. For example, the term "dispersion" may refer to a colloidal dispersion wherein the dispersed phase has a dimension of about 1 nanometer (nm) to about several micrometers (μm) (e.g., 1 μm or less, 2 μm or less, or 3 μm or less).

As used herein, the "Group" refers to the group in the Periodic Table of Elements.

As used herein, "Group II" refers to Group IIA and Group IIB, and examples include Cd, Zn, Hg, and Mg, but are not limited thereto.

"Group III" refers to Group IIIA and Group IIIB, and examples of Group III metal include Al, In, Ga, and Tl, but are not limited thereto.

As used herein, "Group IV" refers to Group IVA and Group IVB, and examples of a Group IV metal include Si, Ge, and Sn, but are not limited thereto. As used herein, the term "metal" may include a semi-metal such as Si.

As used herein, "Group I" refers to Group IA and Group IB, and examples include Li, Na, K, Rb, and Cs, but are not limited thereto.

As used herein, "Group V" refers to Group VA, and examples include N, P, As, Sb, and Bi, but are not limited thereto.

As used herein, "Group VI" refers to Group VIA, and examples include S, Se, and Te, but are not limited thereto.

As used herein, the term "carboxylic acid containing binder" refers to a carboxylic acid group containing polymer.

The quantum dot (hereinafter also referred to as a semiconductor nanocrystal) is not particularly limited, and may be prepared by any known method or is a commercially available. For example, the quantum dot may be a Group II-VI compound, a Group III-V compound, a Group IV-VI compound, a Group IV element or compound, a Group I-III-VI compound, a Group I-II-IV-VI compound, or a combination thereof.

The Group II-VI compound may include:

a binary element compound including CdSe, CdTe, ZnS, ZnSe, ZnTe, ZnO, HgS, HgSe, HgTe, MgSe, MgS, or a combination thereof;

a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may include:

a binary element compound including GaN, GaP, GaAs, GaSb, AlN, AlP, AlAs, AlSb, InN, InP, InAs, InSb, or a combination thereof;

a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may include:

a binary element compound including SnS, SnSe, SnTe, PbS, PbSe, PbTe, or a combination thereof;

a ternary element compound including SnSeS, SnSeTe, SnSTe, PbSeS, PbSeTe, PbSTe, SnPbS, SnPbSe, SnPbTe, or a combination thereof; and a quaternary element compound including SnPbSSe, SnPbSeTe, SnPbSTe, or a combination thereof.

Examples of the Group I-III-VI compound include $CuInSe_2$, $CuInS_2$, CuInGaSe, and CuInGaS, but are not limited thereto.

Examples of the Group I-II-IV-VI compound include CuZnSnSe and CuZnSnS, but are not limited thereto.

The Group IV element or compound may include:

an elementary substance including Si, Ge, or a combination thereof; and a binary element compound including SiC, SiGe, or a combination thereof.

The binary element compound, the ternary element compound, or the quaternary element compound may be respectively included in a uniform concentration or in partially different concentrations within the same particle. The semiconductor nanocrystal particle may have a core-shell structure, wherein a first semiconductor nanocrystal (a core) is surrounded by a second semiconductor nanocrystal (a shell) that is different from the first semiconductor nanocrystal. At the interface between the core and the shell, an alloy interlayer may be present or may not be present. When the quantum dot has an alloy interlayer, the interface between the core and the shell may have a concentration gradient, wherein the concentration of an element of the shell changes (e.g., decreases or increases) toward the core. In addition, the shell may include a multi-layered shell having at least two layers. In the multi-layered shell, each layer may have a single composition, an alloy, or a composition having a concentration gradient.

In the core-shell semiconductor nanocrystal particle, the materials of the shell may have a larger energy bandgap than that of the core or vice versa. In the case of the multi-layered shell, the bandgap of the material of an outer layer of the shell may be higher energy than that of the material of an inner layer of the shell (a layer that is closer to the core).

The quantum dot (i.e., the semiconductor nanocrystal particle) may have a particle diameter (in the case of a non-spherically shaped particle, a longest length of a straight line crossing the particle) of about 1 nm to about 100 nm. For example, the quantum dot may have a particle diameter of about 1 nm to about 20 nm, for example, from 2 nm (or from 3 nm) to 15 nm. In some embodiments, the quantum dot have a diameter of greater than or equal to about 2 nm, greater than or equal to about 3 nm, greater than or equal to about 4 nm, or greater than or equal to about 5 nm and of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

The quantum dot may have a generally-used shape in the art, and is not particularly limited. For example, the quantum dot may include spherical, ellipsoidal, pyramidal, multi-armed, or cubic nanoparticles, nanotubes, nanowires, nanofibers, nanoplate particles, a combination thereof, or the like.

The quantum dot may be commercially available or may be synthesized by any method. For example, several nano-sized quantum dots may be synthesized by a wet chemical process. In the wet chemical process, precursors react in an organic solvent to grow nanocrystal particles, and the organic solvent or a ligand compound may coordinate (or be bound) to the surface of the semiconductor nanocrystal, thereby controlling the growth of the nanocrystal. Examples of the organic solvent and the ligand compound are known in the art. The organic solvent coordinated to the surface of the quantum dot may affect stability of a device, and thus, excess organic materials that are not coordinated to the surface of the quantum dot may be removed by pouring the quantum dot into an excess amount of a non-solvent, and centrifuging the resulting mixture. Examples of the non-solvent include acetone, ethanol, methanol, and the like, but are not limited thereto.

The quantum dot may have an organic ligand bonded to a surface thereof. The organic ligand may have a hydrophobic moiety. In an embodiment, the organic ligand may include RCOOH, $RNH_2$, $R_2NH$, $R_3N$, RSH, $R_3PO$, $R_3P$, ROH, RCOOR', RPO(OH)$_2$, R$_2$POOH (wherein R and R' are the same or different, and are independently a substituted or unsubstituted C5 to C24 aliphatic group such as a substituted or unsubstituted alkyl or alkenyl group, or a substituted or unsubstituted C5 to C20 aromatic group such as an aryl group), a polymeric organic ligand, or a combination thereof.

Examples of the organic ligand compound include:

thiol compounds such as methane thiol, ethane thiol, propane thiol, butane thiol, pentane thiol, hexane thiol, octane thiol, dodecane thiol, hexadecane thiol, octadecane thiol, or benzyl thiol;

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide;

diphenyl phosphine, triphenyl phosphine, or oxide compounds thereof;

a C5 to C20 alkylphosphinic acid such as hexylphosphinic acid, octylphosphinic acid, dodecylphosphinic acid, tetradecylphosphinic acid, hexadecylphosphinic acid, or octadecyl phosphinic acid;

a C5 to C20 alkylphosphonic acid; and the like, but are not limited thereto. The quantum dot may include the hydrophobic organic ligand alone or as a mixture of two or more.

The quantum dot may have a quantum yield (or a quantum efficiency) of greater than or equal to about 10%, for example, greater than or equal to about 30%, greater than or equal to about 50%, greater than or equal to about 60%, greater than or equal to about 70%, greater than or equal to about 90%, or even about 100%. The quantum dot may have a narrow full width half maximum ("FWHM") of the photoluminescent spectrum. For example, the quantum dot may have a FWHM of less than or equal to about 45 nm, for example, less than or equal to about 40 nm, or less than or equal to about 30 nm.

The quantum dot may emit light of wavelength from an ultraviolet range to a visible range, even in a near infrared range or higher. For example, the quantum dot may emit light of a wavelength of about 350 to about 750 nm, for example, about 400 to about 700 nm or may emit light of greater than 700 nm, but it is not limited thereto.

The electronic device including the quantum dot having the foregoing photoluminescent properties is expected to be able to realize enhanced brightness and improved color purity or reproducibility. However, the luminescent properties of the quantum dot may be decreased by the external environment and/or stimulus (e.g., air, moisture, heat and the like), and thus, improvement of the stability in terms of the photoluminescent properties are still desirable for the application of the quantum dot in the device.

To increase the stability, a polymer composite including the quantum dot may be used. However, mixing the quantum dots directly with a matrix polymer may lead to a serious decrease in their properties. In addition, the production of the quantum dot polymer composite entails a heat-treatment, which may in turn lead to a sharp decrease in the luminous properties of the quantum dots. For example, a heat treatment made at a temperature of greater than or equal to about 160° C. or even at a temperature of greater than or equal to about 180° C. may cause a sharp decrease or serious deterioration in the luminous properties of the quantum dot.

Without wishing to be bound by any theory, mixing with chemical substances and/or a heat treating may cause changes in passivation of the quantum dot surface by the organic ligand, which may lead to a decrease in its performances such as luminous properties. In addition, during a polymerization reaction occurring in the presence of the quantum dot, a photoinitiator or a reaction mechanism may have an effect on the efficiency of the quantum dot.

The quantum dot composition of some embodiments may provide a quantum dot polymer composite while preventing or reducing deterioration of the luminous properties of the quantum dot occurring otherwise during the mixing with the polymer or the heat treating. Without wishing to be bound by any theory, in the composition of the embodiments, the thiol group of the first monomer may interact with the surface of the quantum dot to prevent or reduce the changes of the passivation state of the surface of the quantum dot. In addition, the cyclosiloxane, the (meth)acrylate salt of the polyvalent metal, and/or the dithiocarbamate salt of the polyvalent metal may interact with the first and the second monomers or the quantum dot to provide additional network structure besides the crosslinked polymer prepared from the first and the second monomers, which may additional protection to the quantum dot. Accordingly, the composition of the embodiments may prevent or reduce the deterioration of the luminous properties of the quantum dots even when the composition is subjected to a heat treatment at a high temperature of greater than or equal to about 160° C.

In the composition of the embodiments, the first monomer may include a compound represented by Chemical Formula 1:

Chemical Formula 1

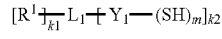

wherein,

R$^1$ includes hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The first monomer may include a compound represented by Chemical Formula 1-1:

Chemical Formula 1-1

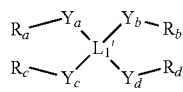

wherein $L_1'$ is carbon, a substituted or unsubstituted C2 to C20 alkylene group, a substituted or unsubstituted C2 to C30 alkylene group wherein at least one methylene (—$CH_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, a substituted or unsubstituted C3 to C30 heterocycloalkylene group, or a combination thereof, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is $R^1$ of Chemical Formula 1 or SH, provided that at least two of $R_a$ to $R_d$ are SH.

The first monomer may include ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol di mercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof (e.g., a compound represented by Chemical Formula 1-2), a compound of Chemical Formula 1-3, a compound of Chemical Formula 1-4, or a combination thereof:

Chemical Formula 1-2

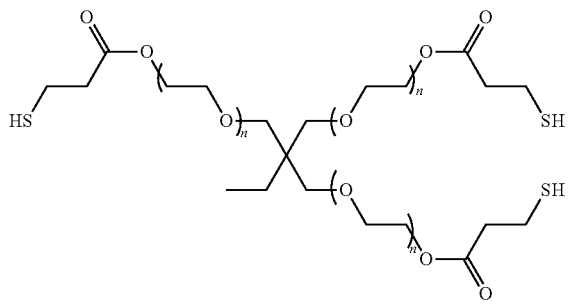

where n is an integer of 1 to 20;

Chemical Formula 1-3

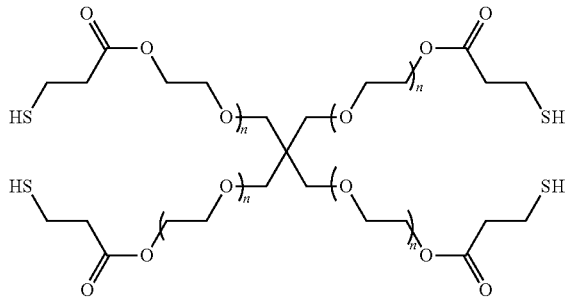

where n is an integer of 1 to 20;

Chemical Formula 1-4

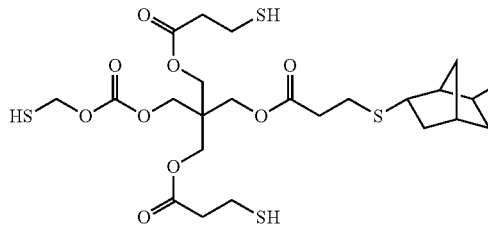 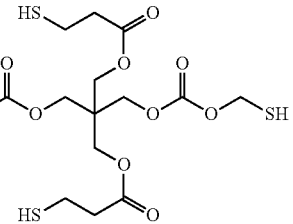

where n is an integer of 1 to 20;

The second monomer may include a compound represented by Chemical Formula 2.

Chemical Formula 2

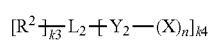

wherein,

X is a C2 to C30 aliphatic organic group including a carbon-carbon double bond, a C6 to C30 aromatic organic group including a carbon-carbon double bond, or a C3 to C30 alicyclic organic group including a carbon-carbon double bond;

$R^2$ is hydrogen, a substituted or unsubstituted C1 to C30 straight or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C30 alkoxy group, a hydroxy group, —$NH_2$, a substituted or unsubstituted C1 to C30 amine group of formula —NRR' wherein R and R' are the same or different, and are each independently hydrogen or a C1 to C30 alkyl group, an isocyanate group, a halogen, —ROR' wherein R is a substituted or unsubstituted C1 to C20 alkylene group and R' is hydrogen or a C1 to C20 straight or branched alkyl group, an acyl halide of formula —RC(=O)X wherein R is a substituted or unsubstituted alkylene group and X is a halogen, —C(=O)OR' wherein R' is hydrogen or a C1 to C20 straight or branched alkyl group, —CN, or —C(=O)ONRR' wherein R and R' are the same or different, and are each independently hydrogen or a C1 to C20 straight or branched alkyl group; $L_2$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C3 to C30 heteroarylene group;

$Y_2$ is a single bond, a substituted or unsubstituted C1 to C30 alkylene group, or a substituted or unsubstituted C2 to C30 alkenylene group; or a C2 to C30 alkylene group or a C3 to C30 alkenylene group wherein at least one methylene group is replaced by a sulfonyl (—$SO_2$—), a carbonyl (—O(=O)—), an ether (—O—), a sulfide (—S—), a sulfoxide (—SO—), an ester (—O(=O)O—), an amide of formula —O(=O)NR— wherein R is hydrogen or a C1 to C10 alkyl group, an imine of formula —NR— wherein R is hydrogen or a C1 to C10 alkyl group, or a combination thereof;

n is an integer of 1 or more;
k3 is an integer of 0 or 1 or more;
k4 is an integer of 1 or more;
the sum of n and k4 is an integer of 3 or more;

n does not exceed the valance of $Y_2$; and
k3 and k4 does not exceed the valence of the $L_2$.

The X moiety in Chemical Formula 2 may include an acrylate group, a methacrylate group, a C2 to C30 alkenyl group, a C3 to C30 alicyclic group substituted with a C2 to C30 alkenyl group, or a C3 to C30 heterocycloalkyl group substituted with a C2 to C30 alkenyl group, or a combination thereof.

The second monomer may be a diallyl compound, a triallyl compound, a diallyl ether compound, a triallyl ether compound, a di(meth)acrylate compound, a tri(meth)acrylate compound, a divinyl ether compound, or a combination thereof.

The second monomer may include a compound represented by Chemical Formulae 2-1, Chemical Formula 2-2, or Chemical Formula 2-3.

Chemical Formula 2-1

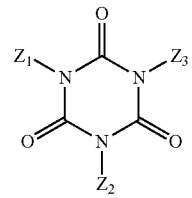

Chemical Formula 2-2

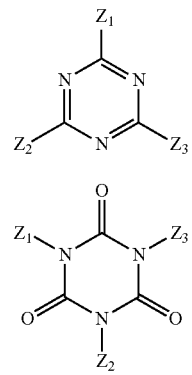

wherein, $Z_1$ to $Z_3$ are the same or different, and each independently correspond to *—[$Y_2$—$X_n$] of Chemical Formula 2, Chemical Formula 2-3

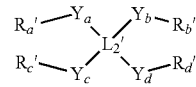

wherein $L_2'$ is carbon, a substituted or unsubstituted C1 to C20 alkylene group, a substituted or unsubstituted C2 to C20 alkenylene group, a C2 to C30 alkylene group wherein at least one methylene (—$CH_2$—) is replaced by sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—)

(wherein R is hydrogen or a C1 to C10 linear or branched alkyl group), or a combination thereof, a C3 to C30 alkenylene group wherein at least one methylene (—CH$_2$—) is replaced by sulfonyl (—S(=O)$_2$—), carbonyl (—O(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a{}'$ to $R_d{}'$ is $R^2$ or X defined in Chemical Formula 2, provided that at least two of $R_a{}'$ to $R_d{}'$ are X defined in Chemical Formula 2.

The second monomer may include a compound represented by Chemical Formula 2-4, a compound represented by Chemical Formula 2-5, a compound represented by Chemical Formula 2-6, a compound represented by Chemical Formula 2-7, a compound represented by Chemical Formula 2-8, a compound represented by Chemical Formula 2-9, a compound represented by Chemical Formula 2-10, a compound represented by Chemical Formula 2-11, a compound represented by Chemical Formula 2-12, a compound represented by Chemical Formula 2-13, a compound represented by Chemical Formula 2-14, a compound represented by Chemical Formula 2-15, or a combination thereof:

Chemical Formula 2-4

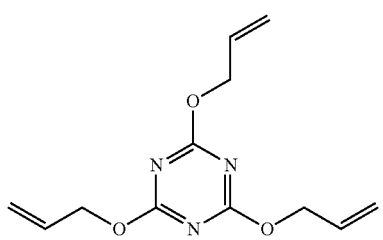

Chemical Formula 2-5

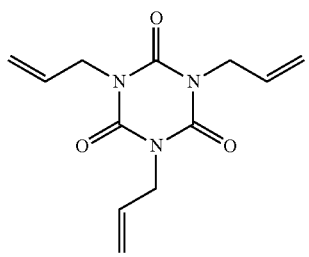

Chemical Formula 2-6

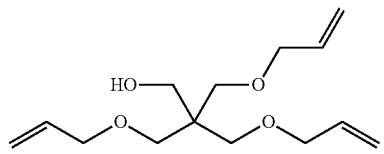

Chemical Formula 2-7

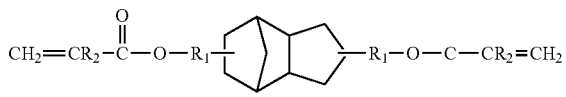

where $R_1$ is a single bond, a C1 to C20 alkylene, or a C2 to C20 alkylene wherein at least one methylene (—CH$_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-8

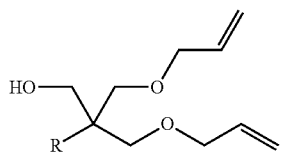

where R is hydrogen or a C1 to C10 alkyl group;

Chemical Formula 2-9

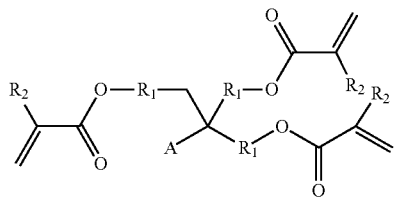

where A is hydrogen, a C1 to C10 alkyl group, or a hydroxyl group, $R_1$ is a single bond, a C1 to C20 alkylene, or a C2 to C20 alkylene wherein at least one methylene (—CH$_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-10

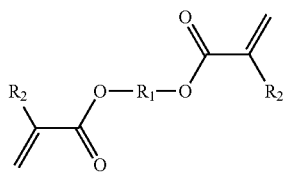

where $R_1$ is a single bond, a C1 to C20 alkylene, or a C2 to C20 alkylene wherein at least one methylene (—$CH_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is hydrogen or a methyl group;

Chemical Formula 2-11

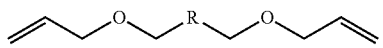

where R is a single bond, a C1 to C20 alkylene, or a C2 to C20 alkylene wherein at least one methylene (—$CH_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof.

Chemical Formula 2-12

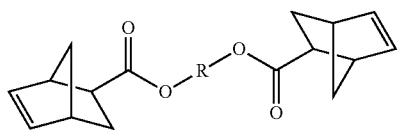

where R is a single bond, a C1 to C20 alkylene, or a C2 to C20 alkylene wherein at least one methylene (—$CH_2$—) is replaced with sulfonyl (—S(=O)$_2$—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, Chemical Formula 2-13

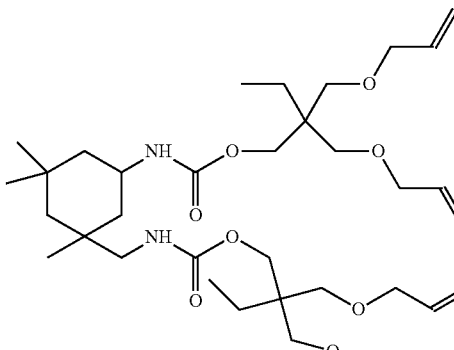

Chemical Formula 2-14

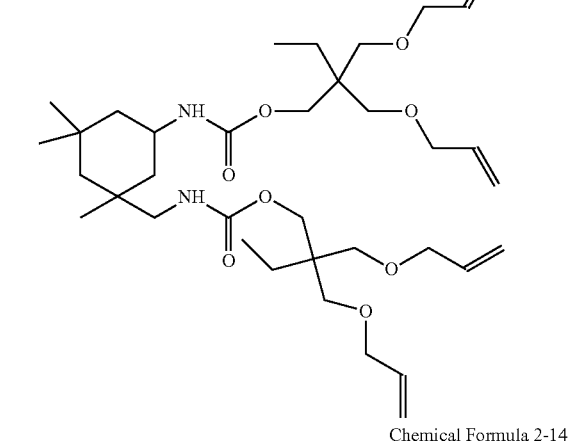

Chemical Formula 2-15

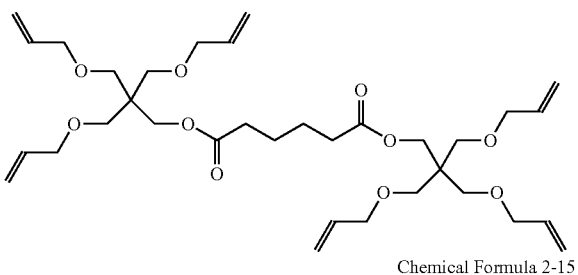

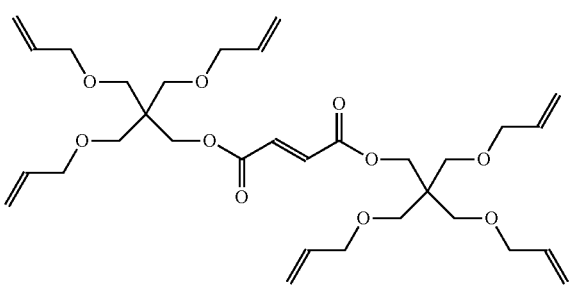

The monomer combination may further include a third monomer having one thiol group at its end terminal (i.e., a monothiol compound), a fourth monomer having one carbon-carbon double bond at its terminal (e.g., a monoacrylate compound), or a combination thereof.

The composition of the embodiments further includes a cyclosiloxane compound having a reactive moiety (e.g., a carbon-carbon double bond and/or a thiol group), a (meth) acrylate salt of a polyvalent metal, an (alkyl)dithiocarbamate of a polyvalent metal, or a combination thereof.

In some embodiments, the cyclosiloxane compound may include a compound represented by Chemical Formula 3:

Chemical Formula 3

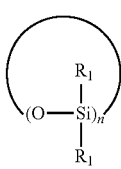

wherein n is an integer of about 3 to about 10, $R_1$ is the same or different and is each independently hydrogen, a C1 to C10 alkyl group, a C1 to C10 alkoxy group, a C1 to C10 mercaptoalkyl group, or -L-$(CR_2)_m$—CR=$CR_2$ (where L is a single bond or —O—, m is 0, greater than or equal to about 1, greater than or equal to about 2, greater than or equal to about 3, and less than or equal to about 16, less than or equal to about 14, less than or equal to about 12, less than or equal to about 10, less than or equal to about 9, less than or equal to about 8, less than or equal to about 7, less than or equal to about 6, or less than or equal to about 5, R is each independently hydrogen or methyl) provided that at least one of $R_1$ is a C1 to C10 mercaptoalkyl group, -L-$(CR_2)_m$—CR=$CR_2$ (where L, m, and R are the same as defined above), or a combination thereof.

For example, when the n is 3, the compound has six $R_1$ moieties, at least one (e.g., two, three, or more) of which is a 01 to C10 mercaptoalkyl group, -L-$(CR_2)_m$—CR=$CR_2$ (where L is a single bond or —O—, m is 0 to 16, R is each independently hydrogen or methyl), or a combination thereof.

For example, when the n is 4, the compound has eight $R_1$ moieties, at least one (e.g., two, three, four, or more) of which is a C1 to C10 mercaptoalkyl group, -L-$(CR_2)_m$—CR=$CR_2$ (where L is a single bond or —O—, m is 0 to 16, R is each independently hydrogen or methyl), or a combination thereof.

The cyclosiloxane compound may have three or four —SiO— units and at least three reactive moieties including a carbon-carbon double bond and a thiol group. In some embodiments, the cyclosiloxane compound may be 2,4,6-trivinyl-2,4,6-trimethyl cyclotrisiloxane, 2,4,6,8-tetramethyl-2,4,6,8-tetravinyl cyclotetrasiloxane, or a combination thereof. The foregoing cyclosiloxane compound may be commercially available or synthesized in any known manner.

The (meth)acrylate salt of the polyvalent metal may include a compound represented by Chemical Formula 4:

M(OCOCR=$CR_2$)n           Chemical Formula 4 where M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and is each independently hydrogen, a C1 to C10 alkyl, or a combination thereof.

The (meth)acrylate salt of the polyvalent metal may have a carbon number of less than or equal to about 7, for example, less than or equal to about 6, less than or equal to about 5, or less than or equal to about 4. In some embodiments, the (meth)acrylate salt of the polyvalent metal may include zinc acrylate, zinc methacrylate, indium acrylate, indium (meth)acrylate, or a combination thereof.

The dithiocarbamate salt (e.g., alkyldithiocarbamate or mono- or dialkyldithiocarbamate) of the polyvalent metal may include a compound represented by Chemical Formula 5:

M[$SCSNR_2$]n           Chemical Formula 5 where M is a polyvalent metal including Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and is each independently hydrogen, a C1 to C10 alkyl group, a C3 to C20 cycloalkyl group, a C6 to C20 aryl group, or a combination thereof.

Preferably, the dithiocarbamate salt of the polyvalent metal is a disubstituted hydrocarbyldithiocarbamate salt wherein each hydrocarbyl group may be the same or different, and may be a C1 to C10 alkyl group, a C3 to C20 cycloalkyl group, a C6 to C20 aryl group, or a combination thereof. In an embodiment, the dithiocarbamate salt of the polyvalent metal is a disubstituted hydrocarbyldithiocarbamate salt wherein at least one of the hydrocarbyl groups is a C1 to C10 alkyl group, and the other hydrocarbyl group may be a C1 to C10 alkyl group, a C3 to C20 cycloalkyl group, or a C6 to C20 aryl group. These may be also referred to herein as an alkyldithiocarbamate salt of the polyvalent metal. The alkyldithiocarbamate salt of the polyvalent metal may include zinc dimethyldithiocarbamate, zinc diethyldithiocarbamate, zinc dibutyldithiocarbamate, zinc dibenzyldithiocarbamate, zinc ethylphenyldithiocarbamate, or a combination thereof.

In the composition, the amount of the quantum dot is not particularly limited and may be controlled properly. For example, per 100 parts by weight of the monomer combination, the amount of the quantum dot may be greater than or equal to about 0.1 parts by weight, greater than or equal to about 1 parts by weight, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, or greater than or equal to about 10 parts by weight. In some embodiments, per 100 parts by weight of the monomer combination, the amount of the quantum dot may be less than or equal to about 80 parts by weight, for example, less than or equal to about 75 parts by weight, less than or equal to about 70 parts by weight, less than or equal to about 65 parts by weight, less than or equal to about 60 parts by weight, less than or equal to about 55 parts by weight, less than or equal to about 50 parts by weight, less than or equal to about 45 parts by weight, less than or equal to about 40 parts by weight, less than or equal to about 35 parts by weight, less than or equal to about 30 parts by weight, less than or equal to about 29 parts by weight, less than or equal to about 28 parts by weight, less than or equal to about 27 parts by weight, less than or equal to about 26 parts by weight, less than or equal to about 25 parts by weight, less than or equal to about 24 parts by weight, less than or equal to about 23 parts by weight, less than or equal to about 22 parts by weight, less than or equal to about 21 parts by weight, or less than or equal to about 20 parts by weight, but is not limited thereto.

In the composition, per 100 parts by weight of the monomer combination, the amount of the additive may be greater than or equal to about 0.001 parts by weight, for example, greater than or equal to about 0.5 parts by weight, or greater than or equal to about 1 part by weight. Per 100 parts by weight of the monomer combination, the amount of the additive may less than or equal to about 50 parts by weight, for example, less than or equal to about 40 parts by weight, less than or equal to about 35 parts by weight, less than or equal to about 30 parts by weight, less than or equal to about 25 parts by weight, less than or equal to about 24 parts by weight, less than or equal to about 23 parts by weight, less than or equal to about 22 parts by weight, less than or equal to about 21 parts by weight, less than or equal to about 20 parts by weight, less than or equal to about 19 parts by weight, less than or equal to about 18 parts by weight, less than or equal to about 17 parts by weight, less than or equal to about 15 parts by weight, less than or equal to about 9 parts by weight, less than or equal to about 8 parts by weight, less than or equal to about 7 parts by weight, less than or equal to about 6 parts by weight, or less than or equal to about 5 parts by weight. The presence of the additive may allow for the polymer composite to form a densely crosslinked structure wherein the quantum dots may be firmly fixed (or anchored). Therefore, in a subsequent process, a leaking phenomenon of the quantum dots (escaping from the composite) may be effectively prevented.

The composition may further include a photoinitiator. The photoinitiator is a compound capable of initiating a radical polymerization of the first and second monomers. Types of the photoinitiator are not particularly limited. For example, the available photopolymerization initiator may include a triazine compound, an acetophenone compound, a benzophenone compound, a thioxanthone compound, a benzoin compound, an oxime ester compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, examples of the triazine compound include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)(piperonyl)-s-triazine, and 2,4-bis(trichloromethyl)(6-paramethoxy styryl)-s-triazine, but are not limited thereto.

Examples of the acetophenone compound include 2,2'-diethoxyacetophenone, 2,2'-dibutoxyacetophenone, 2-hydroxy-2-methylpropinophenone, p-t-butyltrichloroacetophenone, p-t-butyldichloro acetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound include benzophenone, benzoyl benzoate, methylbenzoyl benzoate, 4-phenylbenzophenone, hydroxybenzophenone, (meth)acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound include thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound include benzoin, benzoin methyl ether, benzoin ethyl ether, benzoin isopropyl ether, benzoin isobutyl ether, benzyl dimethyl ketal, and the like, but are not limited thereto.

Examples of the oxime compound include 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

Examples of the phosphine or phosphine oxide compound include 2,4,6-trialkylbenzoyldiphenylphosphine oxide, 2,4,6-trialkylbenzoyldiphenyl phosphinate, or a combination thereof, but are not limited thereto.

In the composition, an amount of the photoinitiator is not particularly limited but may be selected appropriately. For example, the amount of the photoinitiator may be about 0.0001 parts by weight to about 10 parts by weight per 100 parts by weight of the monomer combination.

The composition may further include an organic solvent. The organic solvent may include any solvent capable of dispersing or dissolving the components of the composition (e.g., quantum dots, the first/second monomers, the additives, and the like). The solvent may be selected in light of the affinity with the components in the composition, a boiling point, subsequent processes for the formation of the composite, and the like. Examples of the organic solvent include a substituted or unsubstituted aromatic hydrocarbon, an aliphatic hydrocarbon, a halogenated aliphatic hydrocarbon such as methylene chloride or chloroform, a halogenated aromatic hydrocarbon, and the like, but are not limited thereto. The amount of the organic solvent may be controlled in light of a desired solid content of the composition (i.e., the non-volatile components of the composition such as the quantum dots, the first/second monomers, and the additives). In some embodiments, a balance amount of the composition except for the desired solid (non-volatile) content is the amount of the organic solvent.

The composition of the embodiments may produce a quantum dot polymer composite via a polymerization reaction. Accordingly, in embodiments, a quantum dot polymer composite include a polymer matrix; and a plurality of quantum dots disposed (e.g., dispersed) in the polymer matrix.

The polymer matrix includes a polymerization product of a monomer combination including a first monomer having at least two thiol groups at its end terminals and a second monomer having at least two carbon-carbon double bonds at its end terminals; and an additive moiety, and the additive moiety includes a cyclosiloxane moiety, a (meth)acrylate salt of a polyvalent metal, and a dithiocarbamate salt of a polyvalent metal, or a combination thereof.

Details of the quantum dots and the monomer combination are the same as set forth above. The additive moiety included in the polymer matrix is the same as those derived from the aforementioned additives. Details of the additives are the same as set forth above.

In order to initiate the polymerization reaction between the first monomer and the second monomer, the composition of the embodiments may be irradiated with an ultraviolet ("UV") light. The intensity and the duration of the UV irradiation are not particularly limited and may be selected appropriately. For example, the intensity (e.g., light amount) of the UV light and the irradiation time may be determined in consideration of the types of the monomer, the types of the initiator in order to initiate the polymerization reaction. The atmosphere of the polymerization are not particularly limited but may be selected appropriately. For example, the polymerization may occur in air or in non-air atmosphere (e.g., under an inert gas (nitrogen, argon, or the like) atmosphere, but is not limited thereto.

During the polymerization reaction, the first monomer and the second monomer may form a crosslinked polymer via a free radical chain reaction between the thiol moiety and the carbon-carbon double bond. For example, the radical initiator may remove hydrogen from the thiol moiety to form a thiyl radical (RS.) and the thiyl radical may be added to the carbon of the double bond of the second monomer to form a new radical such as RS—$CR_2$—CR. (where R is hydrogen or an alkyl), which may propagate in various ways (e.g., by reacting with another thiol moiety to form another thiyl radical or by reacting with another carbon of the double bond). Such radical chain reaction may form a highly crosslinked polymer. In the crosslinked polymer, the degree of the crosslinking may be controlled depending on the number of the thiol groups of the first monomer, the number of the double bond of the second monomer, a ratio therebetween, or the like. In some embodiments, the monomer combination may include the first and the second monomers in such a ratio that an amount of the carbon-carbon double bond may be greater than or equal to about 0.1 moles, for example, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole and less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles, per 1 mole of the thiol moiety, but it is not limited thereto.

In addition to the foregoing crosslinked structure, the quantum dot polymer composite of the embodiments may further include crosslinkings formed by the reaction between the additive and the first/second monomers and/or the reaction between the additive and the quantum dots. Without wishing to be bound by any theory, the foregoing crosslinking structure may make it possible for the quantum dot polymer composite to have enhanced thermal stability and improved chemical stability.

The quantum dot polymer composite may exhibit improved maintenance rate of the luminous properties, for example, greater than or equal to about 70% even when the quantum dot polymer composite is thermally-treated at a temperature of about 180° C. for about 30 minutes. As used herein, the term "the maintenance rate of the luminous properties" refers to the ratio of the photoconversion efficiency of the quantum dot polymer composite thermally treated at 180° C. with respect to that of the quantum dot polymer composite prior to being thermally treated.

In some embodiments, the quantum dot polymer composite may be in a form of a film. The film of the quantum dot polymer composite may be obtained by applying the composition of the embodiments and carrying out a polymerization.

In embodiments, the quantum dot polymer composite may be in the form of a population of particles having an average size (i.e., an average particle diameter or an average of the longest length of a straight line across the particle) that is less than or equal to about 10 µm, for example, 9 µm, less than or equal to about 8 µm, less than or equal to about 7 µm, less than or equal to about 6 µm, less than or equal to about 5 µm, less than or equal to about 4 µm, less than or equal to about 3 µm, less than or equal to about 2 µm, or less than or equal to about 1 µm. The population of the particles having the aforementioned average particle size may be prepared by mixing the composition of the embodiments with an organic solvent for polymerization and conducting a polymerization reaction. Examples of the organic solvent for polymerization include a straight or branched alcohol such as ethanol, isopropanol, butanol, pentanol, and the like; an aliphatic hydrocarbon such as hexane; a halogenated aliphatic or aromatic hydrocarbon such as chloroform; ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol acetate, ethylene glycol monoethyl ether acetate, diethylene glycol monoethyl ether acetate, and diethylene glycol monobutyl ether acetate; a propylene glycol solvent such as propylene glycol or a derivative thereof; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate ("PGMEA") and dipropylene glycol monoethyl ether acetate; amides such as N-methylpyrrolidone, dimethyl formamide, and dimethyl acetamide; ketones such as methyl ethyl ketone ("MEK"), methyl isobutyl ketone (MIBK), and cyclohexanone; petroleum products such as toluene, xylene, and solvent naphtha; esters such as ethyl acetate, butyl acetate, and ethyl lactate; ethers such as diethyl ether, dipropyl ether, and dibutyl ether; or any combinations thereof. The composition may further include a surfactant. Examples of the surfactant include cetyltrimethylammonium bromide ("CTAB"), sodium dodecyl sulfate ("SDS"), or a combination thereof.

In some embodiments, for the formation of the quantum dot polymer composite fine particle, quantum dots may be first in contact with an additive such as a (meth)acrylate of a polyvalent metal or a dithiocarbamate salt of a polyvalent metal at a predetermined temperature of, for example, greater than or equal to about 30° C., greater than or equal to about 40° C., or greater than or equal to about 50° C. for a predetermined time period (e.g., about 1 minutes or longer, about 5 minutes or longer, about 10 minutes or longer, or about 30 minutes or longer) and then remaining components of the composition such as the monomers and the initiator are added thereto and the resulting mixture may be stirred to carry out polymerization. In other embodiments, for the formation of the composite fine particle, the quantum dots may be first in contact with the second monomer or the cyclohexane compound having a thiol group at a predetermined temperature of, for example, greater than or equal to about 30° C., greater than or equal to about 40° C., or greater than or equal to about 50° C. for a predetermined time period (e.g., about 1 minutes or longer, about 5 minutes or longer, about 10 minutes or longer, or about 30 minutes or longer) and then remaining components of the composition such as the monomers, the initiator, and/or the (meth)acrylate salt of the polyvalent metal or the dithiocarbamate salt of the polyvalent metal are added thereto and the resulting mixture may be stirred to carry out polymerization.

The quantum dot polymer composite of the embodiments may exhibit improved chemical stability. The quantum dot polymer composite particle may maintain a relatively high level of luminous properties even when they are mixed with other chemical components such as a thiol-ene polymer, a (meth)acrylate polymer, a urethane polymer, an epoxy polymer, a vinyl polymer, a silicone polymer, or a combination thereof.

Embodiments provide a photosensitive composition, which includes: the aforementioned quantum dot polymer composite; a photopolymerizable monomer; a carboxylic acid containing binder; and a photoinitiator. The photosensitive composition may be developed by an alkali aqueous solution.

The photopolymerizable monomer may be any monomer that may be used in a photosensitive composition and are not particularly limited. For example, the photopolymerizable monomer may include at least one (e.g., two, three, four, five, six, or more) carbon-carbon double bond moiety (e.g., a (meth)acrylate moiety). Examples of the photopolymerizable monomer include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, di pentaerythritol penta(meth)acrylate, dipentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, and a combination thereof.

In the composition, the carboxylic acid group containing binder includes a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer having a backbone structure in a main chain and including a carboxylic acid group (—COOH), wherein the backbone structure includes a quaternary carbon atom, which is a part of a cyclic group, and two aromatic rings bound to the quaternary carbon atom; or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 6-1, a unit represented by Chemical Formula 6-2, or a combination thereof:

Chemical Formula 6-1

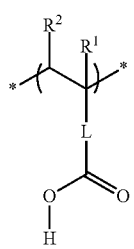

wherein $R^1$ is hydrogen, a C1 to C3 alkyl group, or —$(CH_2)_n$—COOH (wherein n is 0 to 2), $R^2$ is hydrogen, a C1 to C3 alkyl group, or —COOH, L is a single bond, a divalent C1 to C15 aliphatic hydrocarbon group, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and

* indicates a portion linked to an adjacent atom;

Chemical Formula 6-2

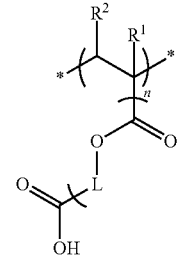

wherein $R^1$ is hydrogen, a C1 to C3 alkyl group, or —$(CH_2)_{n1}$—COOH (wherein n1 is 0 to 2), $R^2$ is hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, n is an integer of 1 to 3, and

* indicates a portion linked to an adjacent atom.

The second repeating unit may include a unit represented by Chemical Formula 7-1, a unit represented by Chemical Formula 7-2, a unit represented by Chemical Formula 7-3, a unit represented by Chemical Formula 7-4, or a combination thereof:

Chemical Formula 7-1

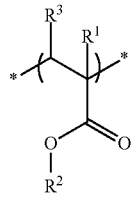

wherein $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom;

Chemical Formula 7-2

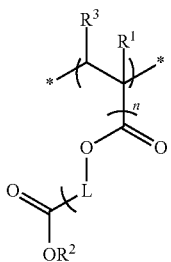

wherein
R¹ is hydrogen or a C1 to C3 alkyl group,
L is a C1 to C15 alkylene group, a C1 to C15 alkylene group wherein at least one methylene group is substituted with —O(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R³ is hydrogen or a C1 to C3 alkyl group,
n is an integer of 1 to 3, and
* indicates a portion linked to an adjacent atom;

Chemical Formula 7-3

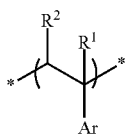

wherein
each of R¹ and R² is independently hydrogen or a C1 to C3 alkyl group,
Ar is a substituted or unsubstituted C6 to C30 aromatic hydrocarbon group or a substituted or unsubstituted C3 to C30 alicyclic hydrocarbon group, and
* indicates a portion linked to an adjacent atom;

Chemical Formula 7-4

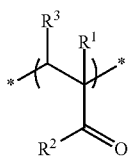

wherein
R¹ is hydrogen or a C1 to C3 alkyl group,
R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R³ is hydrogen or a C1 to C3 alkyl group, and
* indicates a portion linked to an adjacent atom.

The third repeating unit derived from the third monomer may be represented by Chemical Formula 8:

Chemical Formula 8

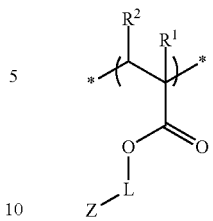

wherein
each of R¹ and R² is independently hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
Z is a hydroxyl group (—OH), a mercapto group (—SH), or an amino group (—NHR, wherein R is hydrogen or a C1 to C5 alkyl group), and
* indicates a portion linked to an adjacent atom.

Examples of the first monomer include, but are not limited to, acrylic acid,
methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer include, but are not limited to:
alkenyl aromatic compounds such as styrene, α-methyl styrene, vinyl toluene, or vinyl benzyl methyl ether;
unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;
unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;
maleimides such as N-phenylmaleimide, N-benzylmaleimide, N-alkylmaleimide;
unsaturated carboxylic acid glycidyl ester compounds such as glycidyl acrylate or glycidyl methacrylate;
vinyl cyanide compounds such as acrylonitrile or methacrylonitrile; and
unsaturated amide compounds such as acrylamide or methacrylamide,
but are not limited thereto.

As the second monomer, at least one compound may be used.

Examples of the third monomer include 2-hydroxy ethyl acrylate, 2-hydroxy ethyl methacrylate, 2-hydroxy butyl acrylate, and 2-hydroxy butyl methacrylate, but are not limited thereto. The third monomer may include one or more compounds.

In the carboxylic acid group containing polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder polymer (i.e., the carboxylic acid group containing polymer), an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxylic acid group containing polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

If present, an amount of the third repeating unit derived from the third monomer in the carboxylic acid group containing polymer may be greater than or equal to about 1 mol %, for example, greater than or equal to about 5 mol %, greater than or equal to about 10 mol %, or greater than or equal to about 15 mol %. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group containing polymer may be a copolymer of (meth)acrylic acid (i.e., the first monomer) and at least one second or third monomer including aryl or alkyl(meth)acrylate, hydroxyalkyl (meth) acrylate, and styrene. For example, the binder polymer may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

In an embodiment, the carboxylic acid group containing polymer may include a multiple aromatic ring-containing polymer. The multiple aromatic ring-containing polymer has a main chain including a backbone structure and includes a carboxylic acid group (—COOH). The backbone structure includes a quaternary carbon atom, which is a part of a cyclic group, and two aromatic rings bound to the quaternary carbon atom (for example, the carboxylic acid group (—COOH) may be bound to the main chain).

In the multiple aromatic ring-containing polymer, the backbone structure may include a unit represented by Chemical Formula A':

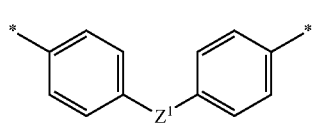

Chemical Formula A' wherein
* indicates a portion that is linked to an adjacent atom of the main chain of the polymer, and $Z^1$ is a linking moiety represented by any one of Chemical Formulae A-1 to A-6, and in Chemical Formulae A-1 to A-6, and * indicates a portion that is linked to an adjacent atom:

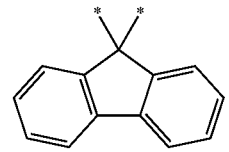

Chemical Formula A-1

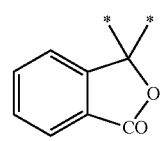

Chemical Formula A-2

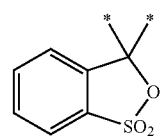

Chemical Formula A-3

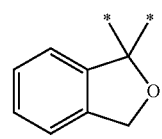

Chemical Formula A-4

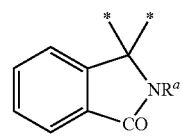

Chemical Formula A-5 wherein $R^a$ is hydrogen, an ethyl group, C2H4Cl, $C_2H_4OH$, $CH_2CH=CH_2$, or a phenyl group,

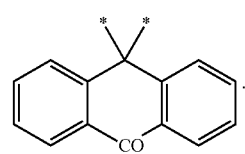

Chemical Formula A-6

The multiple aromatic ring-containing polymer may include a structural unit represented by Chemical Formula B:

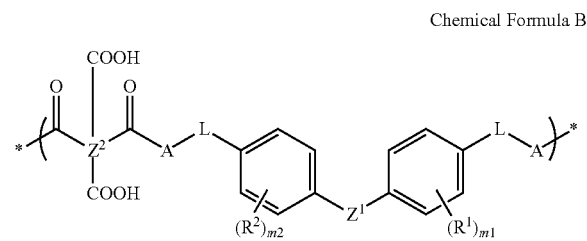

Chemical Formula B wherein
$Z^1$ is a linking moiety represented by any one of Chemical Formulae A-1 to A-6,
L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, each of $R^1$ and $R^2$ is independently hydrogen, a halogen, or a substituted or unsubstituted C1 to C20 alkyl group, m1 and m2 are independently an integer ranging from 0 to 4, A is —NH—, —O—, or a C1 to C10 alkylene, $Z^2$ is a C6 to C40 aromatic organic group, and

* indicates a portion that is linked to an adjacent atom.

In Chemical Formula B, $Z^2$ may be any one of Chemical Formula B-1, Chemical Formula B-2, and Chemical Formula B-3:

Chemical Formula B-1 wherein * indicates a portion that is linked to an adjacent carbonyl carbon,

Chemical Formula B-2 wherein * indicates a portion that is linked to an adjacent carbonyl carbon,

Chemical Formula B-3 wherein * indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

Chemical Formula C wherein each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ includes a linking moiety represented by Chemical Formulae A-1 to A-6, $Z^2$ is an aromatic organic group such as the moieties set forth above, m1 and m2 are independently an integer ranging from 0 to 4, and

* indicates a portion that is linked to an adjacent atom.

In some embodiments, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as follows:

1) epichlorohydrin (12 eq)
   tetra methyl ammonium chloride (3 wt %)
   sodium hydroxide (1.3 eq)
   dimethyl sulfoxide 100° C., 6 h
2) aqueous sodium hydroixde (0.5 eq)
   4-methyl-2-pentanone 100° C., 6 h -continued

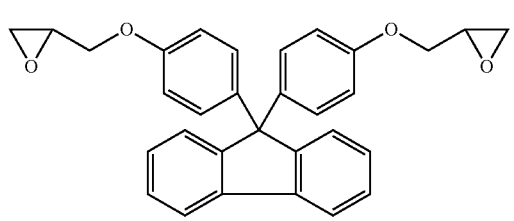
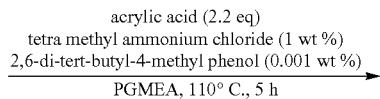

acrylic acid (2.2 eq)
tetra methyl ammonium chloride (1 wt %)
2,6-di-tert-butyl-4-methyl phenol (0.001 wt %)
PGMEA, 110° C., 5 h

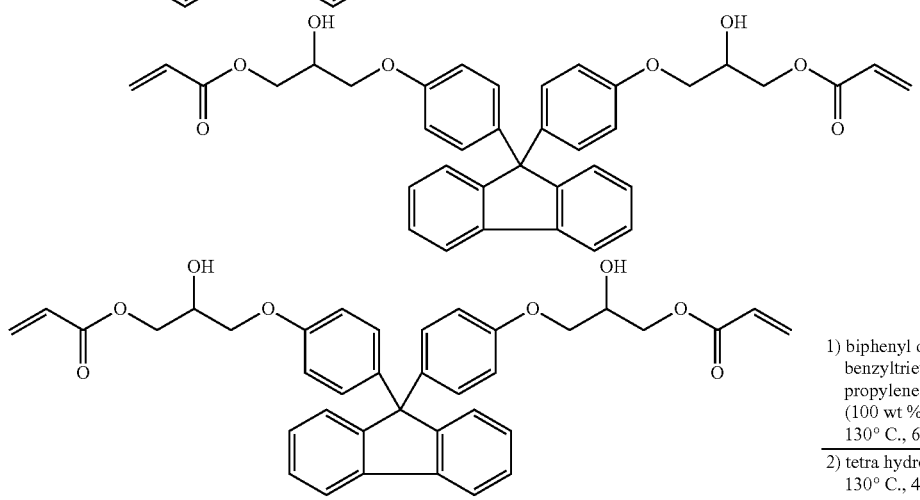

1) biphenyl dianhydride (0.5 eq)
benzyltriethylammonium bromide (3 wt %)
propylene glycol monomethyl ether acetate (100 wt %)
130° C., 6 h
2) tetra hydro phthalix anhydride (0.5 eq)
130° C., 4 h

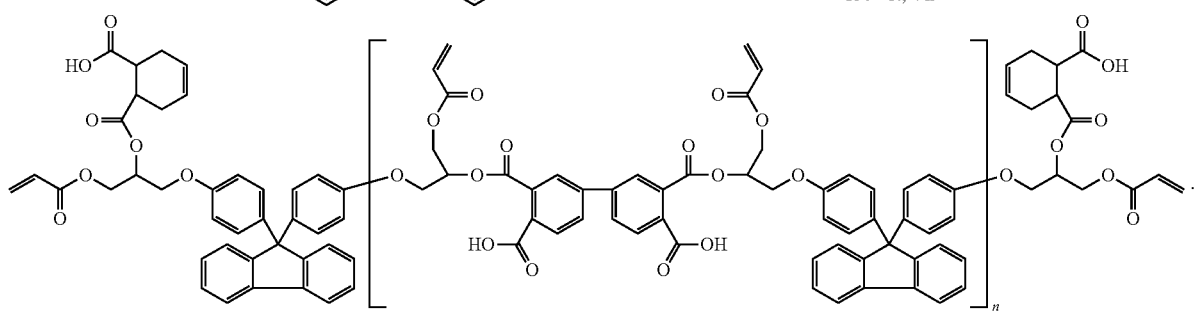

The multiple aromatic ring-containing polymer may include a functional group represented by Chemical Formula D at one or both terminal ends:

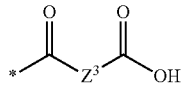

Chemical Formula D wherein
* indicates a portion that is linked to an adjacent atom, and
$Z^3$ is a moiety represented by one of Chemical Formulae D-1 to D-7:

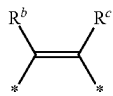

Chemical Formula D-1 wherein each of $R^b$ and $R^c$ is independently hydrogen, a substituted or unsubstituted C1 to C20 alkyl group, or a substituted or unsubstituted C1 to C20 alkyl group, wherein at least one methylene is replaced with an ester group, an ether group, or a combination thereof and
* indicates a portion that is linked to an adjacent atom;

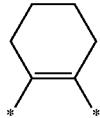

Chemical Formula D-2

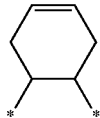

Chemical Formula D-3

Chemical Formula D-4

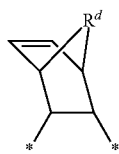

Chemical Formula D-5 wherein $R^d$ is O, S, NH, a substituted or unsubstituted C1 to C20 alkylene group, a C1 to C20 alkylamine group, or a C2 to C20 alkenylamine group;

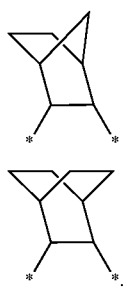

Chemical Formula D-6

Chemical Formula D-7

The multiple aromatic ring-containing polymer may be synthesized by a known method or may be commercially available (e.g., from Nippon Steel Chemical Co., Ltd.).

As non-limiting examples, the multiple aromatic ring-containing polymer may include a reaction product of a fluorene compound including 9,9-bis(4-hydroxyphenyl) fluorene, 9,9-bis(4-aminophenyl)fluorene, 9,9-bis[4-(glycidyloxy)phenyl]fluorene, 9,9-bis[4-(2-hydroxyethoxy)phenyl]fluorene, and 9,9-bis-(3,4-dicarboxyphenyl)fluorene dianhydride with an appropriate compound capable of reacting with the fluorene compound (e.g., an aromatic dianhydride including pyromellitic dianhydride ("PMDA"), biphenyltetracarboxylic dianhydride (BPDA), benzophenone tetracarboxylic dianhydride, naphthalene tetracarboxylic dianhydride, a C2 to C30 diol compound, epichlorohydrine, or the like).

The fluorene compound, dianhydrides, a diol compound, and the like are commercially available, and the reaction conditions therebetween are known in the art.

The carboxylic acid group containing polymer (binder) may have an acid value of greater than or equal to about 50 milligrams of KOH per gram of the polymer (mg KOH/g). For example, the carboxylic acid group containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The binder polymer may have an acid value of, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, less than or equal to about 170 mg KOH/g, or less than or equal to about 160 mg KOH/g, but it is not limited thereto.

Examples of the solvent include, but are not limited to, the foregoing alkylene glycols, the glycol ethers, amides such as N-methylpyrrolidone, dimethyl formamide, and dimethyl acetamide; ketones such as methyl ethyl ketone (MEK), methyl isobutyl ketone (MIBK), and cyclohexanone; petroleum products such as toluene, xylene, and solvent naphtha; esters such as ethyl acetate, butyl acetate, and ethyl lactate; ethers such as diethyl ether, dipropyl ether, and dibutyl ether; or any combinations thereof. Each of the components of the composition may be mixed sequentially or simultaneously and the order of the mixing is not particularly limited. The polymerization of the composition may provide a quantum dot polymer composite. The composite, thus obtained, may be subjected to a post-heating, for example, at a temperature of about 150° C. to 230° C. (e.g., 180° C.) for a predetermined time (e.g., greater than or equal to about 10 minutes (min) or greater than or equal to about 20 min).

The photosensitive composition may include,
about 0.01 weight percent to about 50 weight percent of the quantum dot polymer composite;
about 0.005 weight percent to about 50 weight percent of the carboxylic acid group containing binder;
about 0.005 weight percent to about 30 weight percent of the photopolymerizable monomer;
about 0.0001 weight percent to about 10 weight percent of the photoinitiator; and
a balance amount of the solvent, based on the total weight of the composition, but it is not limited thereto.

If desired, the photosensitive composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition and the preparation of the quantum dot polymer composite.

The light diffusing agent may increase a refractive index of the composition in order to increase a chance of the incident light to meet with quantum dots. The light diffusing agent may include fine particles of an inorganic oxide such as alumina, silica, zirconia, barium oxide, titanium oxide, or zinc oxide, and fine particle of a metal such as gold, silver, copper, or platinum, but is not limited thereto.

The leveling agent is aimed to prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON 5-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent is aimed to increase adhesion with respect to the substrate, and examples thereof may include a silane coupling agent. Examples of the silane coupling agent include vinyl trimethoxysilane, vinyl tris(2-methoxyethoxy)silane, 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, and the like. Types and the amounts of the additives may be adjusted, if desired.

If present, the amount of the additives may be greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but it is not limited thereto.

The composition is coated on a transparent substrate in an appropriate manner such as spin coating to form a film. The formed film may be pre-baked, if desired. The prebaking may be conducted at a temperature of less than or equal to about 120° C., for example, at a temperature of about 80° C. to about 120° C. The duration of the prebake is not particularly limited, but may be selected appropriately. For example, the pre-bake may be carried out for a time of greater than or equal to about 1 minute, for example, greater than or equal to about 2 minutes, or greater than or equal to about 3 minutes, and less than or equal to about 1 hour, for example, less than or equal to about 50 minutes, less than or equal to about 40 minutes, less than or equal to about 30 minutes, less than or equal to about 20 minutes, less than or equal to about 10 minutes, or less than or equal to about 5 minutes, but is not limited thereto. The pre-bake can be carried out under a predetermined atmosphere (e.g., in air, under a non-oxygen atmosphere, or under an inert gas atmosphere) and is not limited thereto.

The formed (and optionally pre-baked) film is exposed to light having a predetermined wavelength for example, under a mask having a predetermined pattern. The wavelength and the intensity of the light may be selected considering the types and the amounts of the photoinitiator, the types and the amounts of the quantum dots, and the like. In the region exposed to light, a crosslinking reaction occurs to form a quantum dot polymer composite wherein the quantum dots are dispersed in the polymer matrix. When the exposed film is treated (e.g., immersed or sprayed) with an alkaline developer (e.g., alkaline aqueous solution), the non-exposed areas of the film are dissolved to form a desired pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min). The photosensitive composition may be developed with an alkaline aqueous solution and thus using the foregoing photosensitive composition may make it possible to provide a quantum dot polymer composite pattern without using an organic solvent based developer.

A non-limiting method of forming a pattern is explained referring to FIG. 1. The photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of 3 to 30 micrometers (μm)). The formed film may be pre-baked, if desired. The specific conditions of pre-baking such as temperature, time, and atmosphere are known in the art and may be appropriately selected.

The formed (or optionally, pre-baked) film is exposed to light of a predetermined wavelength under a mask having a predetermined pattern.

The exposed film is treated with an alkali developing solution, and thereby the unexposed region in the film is dissolved to provide a desirable pattern.

When a quantum dot-polymer composite is to have a plurality of repeating sections, a plurality of compositions each including the quantum dots with a desired light emitting property (e.g., a desired photoluminescent peak wavelength) is prepared for the formation of each of the repeating sections and the patterning process is repeated as many times as necessary (e.g., two times or three times) for each composition to provide a quantum dot-polymer composite having a desirable pattern. For example, the quantum dot polymer composite may be processed to have a repeating pattern having at least two different color sections (e.g., RGB color sections). The pattern of the quantum dot polymer composite may replace an absorption type color filter and thus may be used as a photoluminescent color filter in a display device. The display device may be a liquid crystal display device and a display including an organic light emitting diode ("OLED") as a light source.

FIG. 2 is a cross-sectional view schematically illustrating a liquid crystal display device according to a non-limiting embodiment. Referring to FIG. 2, a liquid crystal display device of an embodiment may include a backlight unit including a light source and a liquid crystal panel 200 disposed over the backlight unit. The liquid crystal panel 200 includes a lower substrate 210, an upper substrate disposed opposite to the lower substrate, a liquid crystal layer 220 disposed between the lower substrate and the upper substrate. On one surface (e.g., the top surface or the bottom surface) of the upper substrate, the aforementioned quantum dot polymer composite pattern may be disposed as a photoluminescent color filter layer. Over and under the liquid crystal panel is disposed an optical element 300. The optical element may be a polarizer.

The backlight unit includes a light source 110. The light source may emit blue light or white light. The light source may include a blue light emitting diode ("LED"), a white LED, or a combination thereof, but is not limited thereto.

The backlight unit may include a light guide panel 120. In an embodiment, the backlight unit may be an edge-type lighting. For example, the backlight unit may include a reflector (not shown), a light guide (not shown) provided on the reflector and providing a planar light source with the liquid crystal panel 200, and/or at least one optical sheet (not shown) on the light guide, for example, a diffusion plate, a prism sheet, and the like, but is not limited thereto. The backlight unit may not have a light guide panel. In some embodiments, the backlight unit may be a direct-type lighting. For example, the backlight unit may have a reflector (not shown), and may have a plurality of fluorescent lamps disposed on the upper side of the reflector at regular intervals, or may have an LED operating substrate on which a plurality of light emitting diodes are disposed, and over them, a diffusion plate and optionally at least one optical sheet may be provided. Details (e.g., each components of light guide and various optical sheets, a reflector, and the like) of such a backlight unit are known and are not particularly limited.

The lower substrate 210, also referred to as an array substrate, may be a transparent insulation material substrate (e.g., a glass substrate, a polymer substrate including a polyester such as polyethylene terephthalate ("PET") or polyethylene naphthalate ("PEN"), polycarbonate, and/or a polyacrylate, inorganic material substrate of a polysiloxane, $Al_2O_3$, or ZnO). A wire plate 211 is disposed on the lower substrate 210.

The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 is disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300. An upper optical element or an upper polarizer 300 may be provided between the liquid crystal layer 220 and the transparent substrate 240, but it is not limited thereto. The upper polarizer may be disposed between the liquid crystal layer 220 and the photoluminescent color filter 130. The polarizer may be any polarizer that can be used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

On the bottom surface of the transparent substrate 240, a black matrix 241 having an opening and hiding the gate line, the data line, and the thin film transistor of the wire plate on the lower substrate may be provided. For example, the black matrix 241 may have a lattice shape. In the openings of the black matrix 241, provided is a photoluminescent layer 230 with a pattern of the quantum dot polymer composite including a first section (R) configured to emit a first light (e.g., red light), a second section (G) configured to emit a second light (e.g., green light), and a third section (B) configured to emit/transmit a third light (e.g., blue light). If desired, the photoluminescent layer may further include at least one of a fourth section. The fourth section may include a quantum dot emitting different colors (e.g., cyan, magenta, and yellow) from the light emitted from the first to third sections.

In the photoluminescent color filter layer 130, the sections constituting a pattern may be repeated corresponding to the pixel areas formed on the lower substrate. A transparent common electrode 231 may be provided on the photoluminescent color filter layer.

The third section (B) configured to emit/transmit blue light may be a transparent color filter that does not change a light emitting spectrum of the light source. In this case, blue light emitted from the backlight unit may pass the polarizer and the liquid crystal layer and then enter as a polarized light and go out as is. If needed, the third section may include quantum dots emitting blue light.

If needed, the display device may further include a blue light blocking layer (blue filter). The blue filter may be disposed between a surface of the first section (R) and the second section (G) and the transparent substrate 300 or over the transparent substrate (not shown). The blue filter may be in the form of a sheet having an opening in a region corresponding to a pixel area (a third section) displaying blue and thus formed in a region corresponding first and second sections. In an embodiment, the blue filter may be formed by alternating at least two layers having different refractive indexes and thus may transmit light in a blue wavelength region but block light in the other wavelength regions. The blocked blue light may be reflected and recycled. The blue filter may play a role of blocking light emitted from a blue light source from being directly emitted outside.

Embodiments provide an electronic device including the foregoing quantum dot polymer composite. The electronic device may include a light emitting diode ("LED"), an organic light emitting diode ("OLED"), a sensor, an imaging sensor, a solar cell device, or a liquid crystal display device, but it is not limited thereto.

Figure 3:
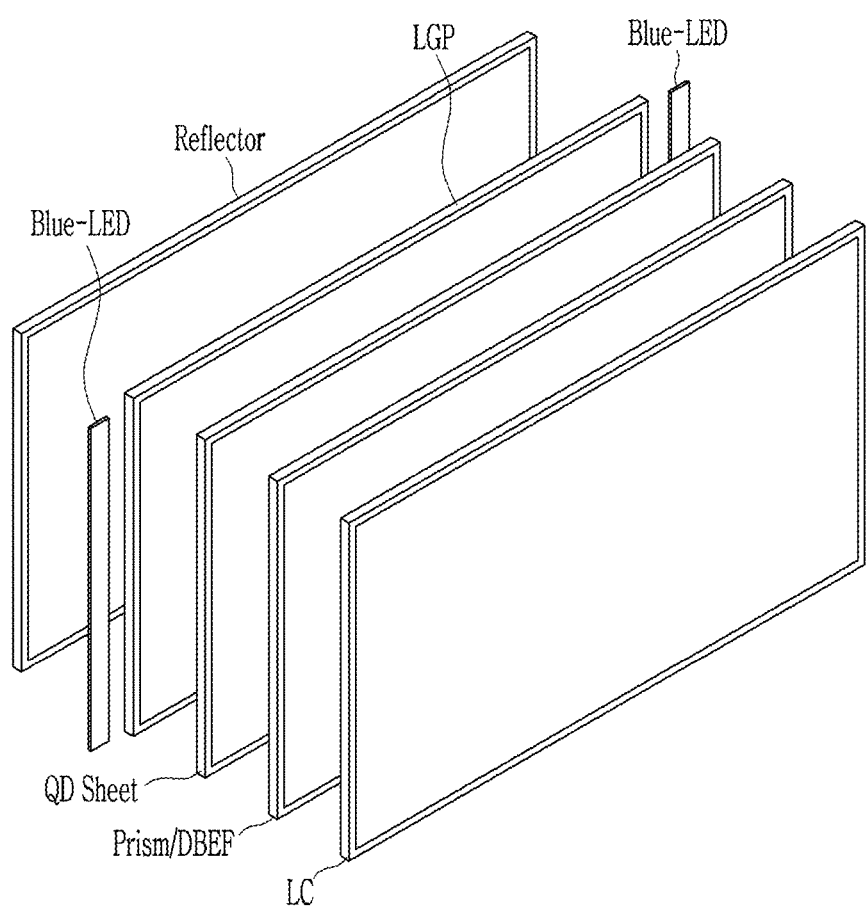
FIG. 3 is an exploded view of an exemplary embodiment of an electronic device.

The aforementioned quantum dot polymer composite may be prepared as a quantum dot sheet. In some non-limiting embodiments, a schematic layered structure of a liquid crystal display device including the quantum dot sheet is shown in FIG. 3. A general structure of the liquid crystal display ("LCD") are known in the art and FIG. 3 schematically shows the same.

Referring to FIG. 3, the liquid crystal display may include a reflector, a light guide panel, a Blue LED, a quantum dot polymer composite sheet, various optical sheets such as a prism sheet, a double brightness enhance film ("DBEF"), which are layered to form a layered structure, and a liquid crystal panel may be disposed on the top of the layered structure.

Figure 4:
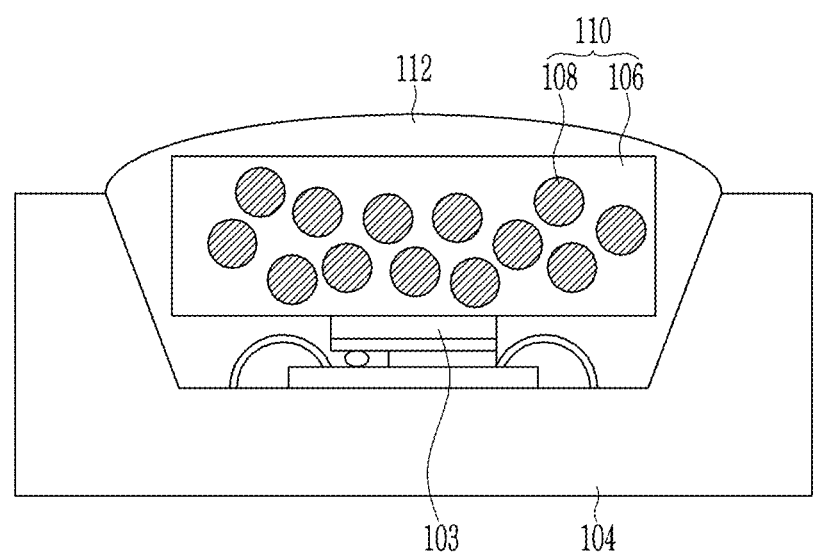
FIG. 4 is a schematic cross-section view of an exemplary embodiment of a light emitting device.

A schematic cross-section view of an exemplary embodiment of a light emitting device including the quantum dot polymer composite is shown in FIG. 4. In FIG. 4, the light emitting device includes a substrate or a container 104, a light emitting diode chip 103, an encapsulating polymer 112, a quantum dot polymer composite 110, and the quantum dot polymer composite particle 108 dispersed in polymer matrix 106.

Hereinafter, the embodiments are illustrated in more detail with reference to examples. However, the present disclosure is not limited thereto.

EXAMPLES

Analysis Method

[1] Microscopic Analysis

ECLIPSE 100D, NIKON microscope is used to analyze a surface of an obtained quantum dot polymer composite in accordance with a Dark Field microscopy method and a Fluorescence microscopy method.

[2] Measurement of Particle Size by the Dynamic Light Scattering Method

By using ELS-Z2 PLUS, OTSUKA, a particle (average) size and a standard deviation thereof are measured in accordance with the Dynamic Light Scattering ("DLS") method.

[3] Conversion Efficiency of a Quantum Dot Polymer Composite

The "photoconversion efficiency" or "conversion efficiency" is a ratio of emitted light amount of the quantum dot polymer composite to the absorbed light amount thereof from the excitation light (e.g., blue light). A total amount of the excitation light (e.g., a total amount of the blue light, B) may be obtained by integrating a photoluminescent spectrum of the excitation light. A PL spectrum of the quantum dot polymer composite is obtained and from the PL spectrum, thus obtained, an amount of the blue light (B') and an amount of the light (A) that is emitted from the quantum dot polymer composite and has a green and/or red wavelength range are measured, respectively. Then, the photoconversion efficiency is calculated by the following equation:

$$A/(B-B') \times 100 = (photo)\text{conversion efficiency (\%)}.$$

In order to measure the photoconversion efficiency, the quantum dot-polymer composite film is inserted between the light guide panel and optical film of a 60 inch TV set equipped with a blue LED having a peak wavelength of 449 nm. Then, the photoluminescent spectrum of the semiconductor nanocrystal-polymer composite film is measured using a spectro-radiometer (Konica Minolta, CS-2000) placed 45 centimeters in front of the TV during operation of the TV. The photoconversion efficiency is calculated from the obtained photoluminescent spectrum.

[4] Quantum Yield

A quantum yield is a value obtained by dividing the number of the photons emitted from the sample by the number of the photons adsorbed by the same. For the quantum dot containing composition and the quantum dot polymer composite, HAMAMATSU-Quantaurus-QY, C11347 (manufactured by Hamamatsu Co., Ltd.) is used to measure the quantum yield.

The relative QY is a ratio of the QY of the given quantum dots with respect to that of the reference quantum dots.

Reference Example 1: Preparation of Core-Shell Quantum Dots

Reference Example: Preparation of Red Light Emitting Quantum Dots and Green Light Emitting Quantum Dots (1) 0.2 millimoles (mmol) of indium acetate, 0.6 mmol of palmitic acid, and 10 milliliters (mL) of 1-octadecene are placed in a flask, heated under vacuum at 120° C. for one hour, and heated to 280° C. after the atmosphere in the flask is exchanged with $N_2$. Then, a mixed solution of 0.1 mmol of tris(trimethylsilyl)phosphine ("$TMS_3P$") and 0.5 mL of trioctylphosphine ("TOP") is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene. The first absorption maximum in an ultraviolet-visible spectroscopy ("UV-VIS") spectrum of the InP core nanocrystals, thus prepared, may be in the range of 420 to 600 nanometers (nm).

0.3 mmol (0.056 grams, g) of zinc acetate, 0.6 mmol (0.189 g) of oleic acid, and 10 mL of trioctylamine are placed in a flask, heated under vacuum at 120° C. for 10 minutes, and then heated to 220° C. after the atmosphere in the flask is exchanged with $N_2$. Then, a toluene dispersion of the InP core nanocrystals prepared as described above (optical density: 0.15) and 0.6 mmol S/TOP (i.e., sulfur dissolved or dispersed in the TOP) are added to the flask, and then, the resulting mixture is heated to 280° C., and the reaction proceeds for 30 minutes. After the reaction, the reaction solution is quickly cooled to room temperature to obtain a reaction mixture including InP/ZnS semiconductor nanocrystals.

(2) An excess amount of ethanol is added to the reaction mixture including the InP/ZnS semiconductor nanocrystals, which is then centrifuged. After centrifugation, the supernatant is discarded and the precipitate is dried and dispersed in chloroform ("CF") or methylene chloride ("MC"). A UV-vis absorption spectrum of the resulting dispersion is measured. The prepared semiconductor nanocrystals emit green light.

Reference Example 2: Preparation of Photosensitive Composition Including Quantum Dots The chloroform dispersion of the green light emitting quantum dots prepared in Reference Example 1 is added to a solution of a binder polymer of a four-component copolymer of methacrylic acid, benzyl methacrylate, hydroxyethyl methacrylate, and styrene, acid value: 130 milligrams (mg) per gram of KOH (mg KOH/g), molecular weight: 8,000 g/mol, acrylic acid:benzyl methacrylate:hydroxyethyl methacrylate:styrene (molar ratio)=61.5%:12%:16.3%:10.2%) (in polypropylene glycol monomethyl ether acetate, a concentration of 30 percent by weight, wt %) to form a quantum dot-binder dispersion. To the quantum dot-binder dispersion as prepared, glycol di-3-mercaptopropionate (hereinafter, 2T) having the following structure, hexaacrylate having the following structure (as a photopolymerizable monomer), and an oxime ester compound (as an initiator) are added to obtain a quantum dot-photosensitive composition (hereinafter, also referred to as QD/PR).

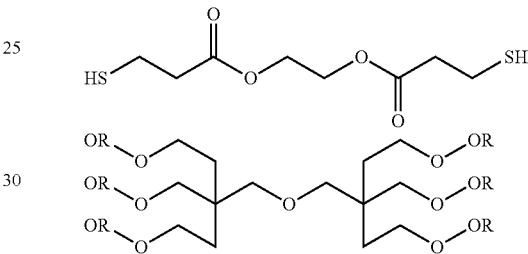

wherein

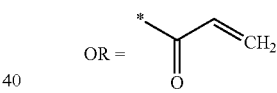

and "*" indicates a point of attachment.

Preparation of Quantum Dot Polymer Composite Film I

Example 1

To the quantum dot chloroform dispersion prepared in Reference Example 1 are added pentaerythritol tetrakis(2-mercaptoacetate) (a first monomer, hereinafter referred to as "PETSA") and 1,3,5-triallyl-1,3,5-triazine-2,4,6-trione (a second monomer, hereinafter referred to as "TTT"); 2,4,6,8-tetramethyl-2,4,6,8-tetravinylcyclotetrasiloxane (hereinafter, referred to as "4CySi"); and a photoinitiator (i.e., trioctylphosphine, hereinafter referred to as TOP) and the resulting mixture is vortexed to provide a composition. The ratio between the first monomer and the second monomer is adjusted so that in the composition, the ratio between the thiol moiety and the ene moiety becomes 1:1. The amount of the 4CySi and the amount of the photoinitiator are 25 parts by weight and 0.1 parts by weight per 100 parts by weight of the combination of the first and second monomers. The amount of the quantum dot is 40% of the total solid content and in the composition, the total solid content is 30% by weight.

The prepared composition is coated on a glass substrate and pre-baked for 2 minutes at 100° C., exposed to UV (wavelength: 365 nm, intensity: 60 millijoules (mJ)) for 1 second, and post-baked for 30 minutes at 180° C. to obtain a quantum dot polymer composite film. The blue light conversion rate is measured for each of the pre-baked film and the post-baked film, and the blue light conversion rate of the post baked film is calculated with respect to that of the pre-baked film and the results are compiled in Table 1.

Comparative Example 1

A quantum dot polymer composite film is obtained in the same manner as Example 1 except for using the composition prepared in Reference Example 2. The blue light conversion rate is measured for each of the pre-baked film and the post-baked film, and the blue light conversion rate of the post baked film is calculated with respect to that of the pre-baked film and the results are compiled in Table 1.

Comparative Example 2

A quantum dot polymer composite film is obtained in the same manner as Example 1 except for not using the 4CySi. The blue light conversion rate is measured for each of the pre-baked film and the post-baked film, and the blue light conversion rate of the post baked film is calculated with respect to that of the pre-baked film and the results are compiled in Table 1.

Comparative Example 3

A quantum dot polymer composite film is obtained in the same manner as Example 1 except for using 4,4-bis(mercaptomethyl)biphenyl instead of the 4CySi. The blue light conversion rate is measured for each of the pre-baked film and the post-baked film, and the blue light conversion rate of the post baked film is calculated with respect to that of the pre-baked film and the results are compiled in Table 1.

Comparative Example 4

A quantum dot polymer composite film is obtained in the same manner as Example 1 except for using a linear siloxane compound (i.e., polydimethyldiloxane, PDMS) instead of the 4CySi. The blue light conversion rate is measured for each of the pre-baked film and the post-baked film, and the blue light conversion rate of the post baked film is calculated with respect to that of the pre-baked film and the results are compiled in Table 1.

TABLE 1

|  | After PRB | After POB |
| --- | --- | --- |
| Comp. Example 1 (ref) | 100% | 70% |
| Example 1 | 134% | 82% |
| Comp. Example 2 | 128% | 68% |
| Comp. Example 3 | 128% | 65% |
| Comp. Example 4 | 124% | 68% |

The results of Table 1 confirm that the composite of Example 1 has a significantly improved luminous efficiency in comparison with the composite of Comparative Example 1. In addition, the composite of Example 1 may exhibit significantly improved luminous efficiency even after the post bake treatment in comparison with the composites of Comparative Examples 2 and 3. The results indicate that the quantum dot polymer composite of Example 1 may achieve enhanced chemical and thermal stability.

Preparation of Quantum Dot Polymer Composite Film II

Examples 2 to 4

A composition is obtained in the same manner as Example 1 except for using zinc acrylate in an amount of one parts by weight (for Example 2), 3 parts by weight (for Example 3), and 6 parts by weight (for Example 4) per 100 parts by weight of the combination of the first and the second monomers, respectively, instead of the 4CySi. Using each of the obtained composition, a quantum dot polymer composite film is prepared in the same manner as set forth in Example 1. The blue light conversion rate is measured for each of the pre-baked film and the post-baked film, and the blue light conversion rate of the post baked film is calculated with respect to that of the pre-baked film and the results are compiled in Table 2.

Examples 5 to 7

A composition is obtained in the same manner as Example 1 except for using zinc diethyldithiocarbamate in an amount of one parts by weight (for Example 5), 3 parts by weight (for Example 6), and 6 parts by weight (for Example 7) per 100 parts by weight of the combination of the first and the second monomers, respectively, instead of the 4CySi. Using each of the obtained composition, a quantum dot polymer composite film is prepared in the same manner as set forth in Example 1. The blue light conversion rate is measured for each of the pre-baked film and the post-baked film, and the blue light conversion rate of the post baked film is calculated with respect to that of the pre-baked film and the results are compiled in Table 2.

Comparative Example 5

A composition is obtained in the same manner as Example 1 except for using zinc stearate instead of the 4CySi. Using the obtained composition, a quantum dot polymer composite film is prepared in the same manner as set forth in Example 1. The blue light conversion rate is measured for each of the pre-baked film and the post-baked film, and the blue light conversion rate of the post baked film is calculated with respect to that of the pre-baked film and the results are compiled in Table 2.

TABLE 2

|  | C.E. after PRB | C.E. after POB |
| --- | --- | --- |
| Comp. Example 2 | 100% | 61% |
| Example 5 (ZA-1%) | 101% | 77% |
| Example 6 (ZA-3%) | 94% | 74% |
| Example 7 (ZA-6%) | 92% | 73% |
| Example 8 (ZnDTC-1%) | 103% | 71% |
| Example 9 (ZnDTC-3%) | 103% | 76% |
| Example 10 (ZnDTC-6%) | 101% | 79% |
| Comp. Example 5 (using Zn stearate) | 101% | 65% |

C.E.: conversion efficiency

The results of Table 2 confirm that the quantum dot polymer composite of the Examples may show significantly stability in comparison with that of Comparative Examples 2 and 5.

Preparation of Quantum Dot Polymer Fine Particles

Examples 8 to 9

Using zinc acrylate in an amount of 17 parts by weight per 100 parts by weight of the combination of the first and second monomers instead of the 4CySi, sub-micron sized fine particles of quantum dot polymer composite are obtained in the following manner.

In case of Example 8, zinc acrylate is added to the quantum dot chloroform dispersion obtained in Reference Example 1. Then, pentaerythritol tetrakis(2-mercaptoacetate) (the first monomer, hereinafter PETSA), 1,3,5-triallyl-1,3,5-triazine-2,4,6-trione (the second monomer, hereinafter, TTT), and an initiator, trioctylphosphine (TOP) are added to PGMEA to form a mixed solution (a thiol moiety: an ene moiety (mole ratio)=1:1). The amount of the initiator is 0.1 parts by weight per 100 parts by weight of the combination of the first and second monomers.

The mixed solution is added dropwise to the quantum dot chloroform dispersion including the zinc acrylate and stirred to obtain composite fine particles.

In case of Example 9, in order to form a mixed solution, pentaerythritol tetrakis(2-mercaptoacetate) (the first monomer, PETSA), 1,3,5-triallyl-1,3,5-triazine-2,4,6-trione (the second monomer, TTT), and an initiator, trioctylphosphine (TOP) are added to the quantum dot chloroform dispersion obtained in Reference Example 1 in such an amount that the mole ratio between the thiol moiety and the ene moiety (a thiol moiety:an ene moiety) becomes 1:1. Zinc acrylate is added to PGMEA to prepare a Zn acrylate solution. The Zn acrylate solution is added dropwise to the mixed solution and stirred to obtain composite fine particles. The amount of the initiator is 0.1 parts by weight per 100 parts by weight of the combination of the first and second monomers.

The mixed solution is added dropwise to the quantum dot chloroform dispersion including the zinc acrylate and stirred to obtain composite fine particles.

In the preparation of the composite fine particles in Examples 8 and 9, the amount of the quantum dot is about 13 wt % based on a total solid content weight. In the solution, the solid content is about 30% based on a total weight of the composition.

Figure 5:
FIG. 5 is a dark field microscopic image of the zinc acrylate/pentaerythritol tetrakis(2-mercaptoacetate) ("PETSA")/1,3,5-triallyl-1,3,5-triazine-2,4,6-trione ("TTT") bead prepared in Example 8.
Figure 6:
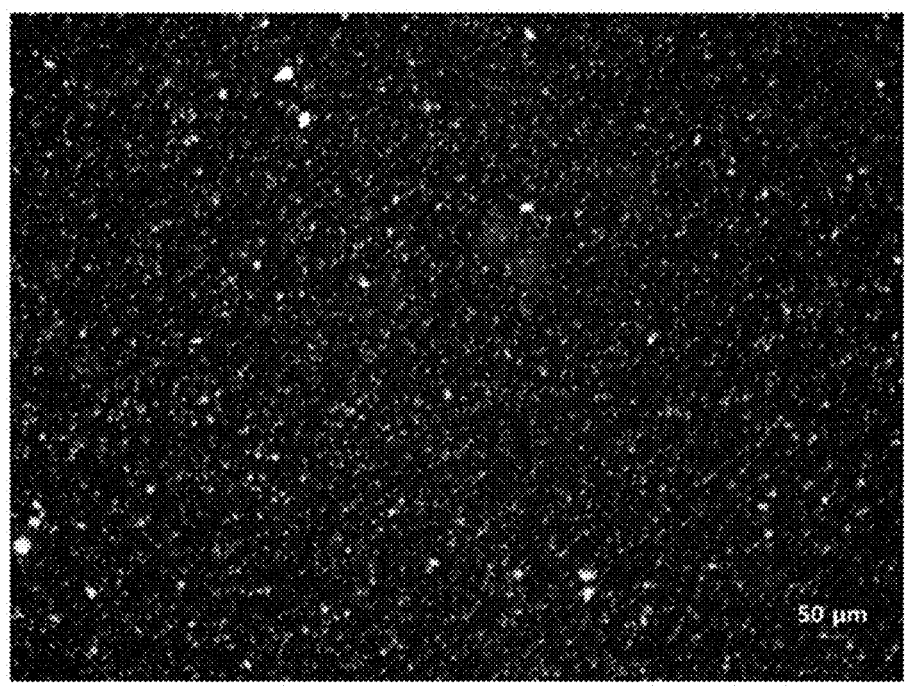
FIG. 6 is a fluorescence microscopic image of the zinc acrylate/PETSA/TTT bead prepared in Example 8.

With respect to the obtained composite particle, analysis using a dark filed microscope and a fluorescence microscope is made, and the results are shown in FIG. 5 and FIG. 6, respectively. The microscopic analysis results confirm that each of the particles include the quantum dots.

Using a dynamic light scattering method, an average size and a standard deviation are measured for the obtained particles, and the results are compiled in Table 3.

TABLE 3

| | Number average diameter ± standard deviation (STD) (nm) |
|---|---|
| Example 8 | 917 ± 252 |
| Example 9 | 42 ± 12 |

Preparation of a Photosensitive Composition

Example 10

A composition is prepared in the same manner as set forth in Reference Example 2 except for using the quantum dot polymer composite particles prepared in Example 8 instead of the quantum dot chloroform dispersion of Reference Example 1.

A quantum yield is measured for each of the quantum dot chloroform dispersion of Reference Example 1, the composition of Reference Example 2, and the photosensitive composition of Example 10, respectively, and the relative quantum yield with respect to the quantum yield of the dispersion of Reference Example 1 is calculated and compiled in Table 4.

TABLE 4

| | Relative QY (%) |
|---|---|
| Reference Example 1 | 100 |
| Reference Example 2 | 63 |
| Example 10 | 100 |

The results of Table 4 confirm that in case of the quantum dot polymer composite particle may have a luminous efficiency comparable to that of the quantum dots in an organic solvent. Such results confirm that the quantum dot composite particles may achieve enhanced chemical stability.

While this disclosure has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. A composition comprising:
   a plurality of quantum dots;
   a monomer combination comprising a first monomer having at least two thiol groups at terminal ends of the first monomer and a second monomer having at least two carbon-carbon double bonds at terminal ends of the second monomer; and
   a non-polymeric additive,
   wherein the non-polymeric additive comprises a dithiocarbamate salt of a polyvalent metal.

2. The composition of claim 1, wherein the quantum dot comprises a Group II-VI compound, a Group III-V compound, a Group IV-VI compound, a Group IV element or compound, a Group compound, a Group I-II-IV-VI compound, or a combination thereof.

3. The composition of claim 1, wherein the first monomer comprises a compound represented by Chemical Formula 1 and the second monomer comprises a compound represented by Chemical Formula 2:

Chemical Formula 1 wherein,
$R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, $-NH_2$, a substituted or unsubstituted C1 to C30 amine group ($-NRR'$, wherein R and R' are the same or different, and are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a combination thereof, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$; and Chemical Formula 2

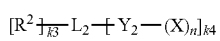

wherein,

X is a C2 to C30 aliphatic organic group comprising a carbon-carbon double bond, a C6 to C30 aromatic organic group comprising a carbon-carbon double bond, or a C3 to C30 alicyclic organic group comprising a carbon-carbon double bond;

$R^2$ is hydrogen, a substituted or unsubstituted C1 to C30 straight or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C30 alkoxy group, a hydroxy group, —$NH_2$, a substituted or unsubstituted C1 to C30 amine group of formula —NRR' wherein R and R' are each the same or different, and are independently hydrogen or a C1 to C30 alkyl group, an isocyanate group, a halogen, —ROR' wherein R is a substituted or unsubstituted C1 to C20 alkylene group and R' is hydrogen or a C1 to C20 straight or branched alkyl group, an acyl halide of formula —RC(=O)X wherein R is a substituted or unsubstituted alkylene group and X is a halogen, —C(=O)OR' wherein R' is hydrogen or a C1 to C20 straight or branched alkyl group, —CN, or —C(=O)ONRR' wherein R and R' are the same or different, and are each independently hydrogen or a C1 to C20 straight or branched alkyl group;

$L_2$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a combination thereof;

$Y_2$ is a single bond, a substituted or unsubstituted C1 to C30 alkylene group, or a substituted or unsubstituted C2 to C30 alkenylene group; or a C2 to C30 alkylene group or a C3 to C30 alkenylene group wherein at least one methylene group is replaced by a sulfonyl (—$SO_2$—), a carbonyl (—C(=O)—), an ether (—O—), a sulfide (—S—), a sulfoxide (—S=O—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;

n is an integer of 1 or more;

k3 is an integer of 0 or 1 or more;

k4 is an integer of 1 or more;

the sum of n and k4 is an integer of 3 or more;

n does not exceed the valance of $Y_2$ when $Y_2$ is not a single bond; and k3 and k4 does not exceed the valence of the $L_2$.

4. The composition of claim 3, wherein the first monomer comprises a compound represented by Chemical Formula 1-1:

Chemical Formula 1-1

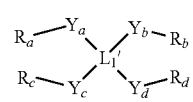

wherein $L_1'$ is carbon, a substituted or unsubstituted C1 to C20 alkylene group, a substituted or unsubstituted C2 to C30 alkylene group wherein at least one methylene (—$CH_2$—) is replaced with sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, a substituted or unsubstituted C3 to C30 heterocycloalkylene group, or a combination thereof;

each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is R$^1$ of Chemical Formula 1 or SH, provided that at least two of $R_a$ to $R_d$ are SH.

5. The composition of claim 3, wherein the X moiety in Chemical Formula 2 comprises an acrylate group, a methacrylate group, a C2 to C30 alkenyl group, a C3 to C30 alicyclic group substituted with a C2 to C30 alkenyl group, or a C3 to C30 heterocycloalkyl group substituted with a C2 to C30 alkenyl group, or a combination thereof.

6. The composition of claim 1, wherein the second monomer comprises a compound represented by Chemical Formulae 2-1, Chemical Formula 2-2, or Chemical Formula 2-3,

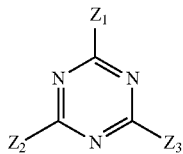

Chemical Formula 2-1

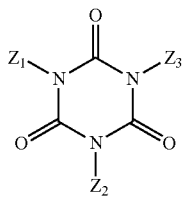

Chemical Formula 2-2 wherein $Z_1$ to $Z_3$ are the same or different, and each independently correspond to —[Y$_2$—X$_n$] of Chemical Formula 2,

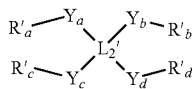

Chemical Formula 2-3 wherein L$_2$' is carbon, a substituted or unsubstituted C1 to C20 alkylene group, a substituted or unsubstituted C2 to C20 alkenylene group, a C2 to C30 alkylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, a substituted or unsubstituted C3 to C30 heterocycloalkylene group, or a combination thereof, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$' to $R_d$' is R$^2$ or X defined in Chemical Formula 2, provided that at least two of $R_a$' to $R_d$' are X defined in Chemical Formula 2.

7. The composition of claim 1, wherein an amount of the additive is greater than or equal to about 0.001 parts by weight and less than or equal to about 50 parts by weight per 100 parts by weight of the monomer combination.

8. The composition of claim 1, wherein the amount of carbon-carbon double bonds is 0.1 moles to 20 moles per one mole of thiol moieties.

9. The composition of claim 1, wherein the dithiocarbamate salt of the polyvalent metal comprises a compound represented by Chemical Formula 5:

$$M[SC\ SNR_2]_n \qquad \text{Chemical Formula 5}$$

where M is a polyvalent metal comprising Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and is each independently hydrogen, a substituted or unsubstituted C1 to C10 alkyl, a substituted or unsubstituted C3 to C20 cycloalkyl group, a substituted or unsubstituted C6 to C20 aryl group, or a combination thereof.

10. The composition of claim 9, wherein the dithiocarbamate salt of the polyvalent metal represented by Chemical Formula 5 comprises zinc diethyldithiocarbamate.

11. A quantum dot polymer composite comprising:
a polymer matrix; and
a plurality of quantum dots disposed in the polymer matrix,
wherein the polymer matrix comprises:
 a polymerization product of a monomer combination comprising a first monomer having at least two thiol groups at terminal ends of the first monomer and a second monomer having at least two carbon-carbon double bonds at terminal ends of the second monomer; and
 a non-polymeric additive moiety,
wherein the non-polymeric additive moiety comprises a moiety derived from a dithiocarbamate salt of a polyvalent metal.

12. The quantum dot polymer composite of claim 11, wherein the first monomer comprises a compound represented by Chemical Formula 1 and the second monomer comprises a compound represented by Chemical Formula 2:

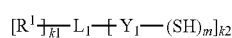   Chemical Formula 1 wherein,
- $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof,
- $L_1$ is a carbon atom, a substituted or unsubstituted C1 to C30 alkylene group, a substituted or unsubstituted C2 to C30 alkylene group wherein at least one methylene (—CH$_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a combination thereof,
- $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof,
- m is an integer of 1 or more,
- k1 is 0 or an integer of 1 or more, k2 is an integer of 1 or more, and
- the sum of m and k2 is an integer of 3 or more, provided that m does not exceed the valence of $Y_1$ when $Y_1$ is not a single bond, and
provided that the sum of k1 and k2 does not exceed the valence of $L_1$; and

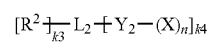   Chemical Formula 2 wherein,
- X is a C2 to C30 aliphatic organic group comprising a carbon-carbon double bond, a C6 to C30 aromatic organic group comprising a carbon-carbon double bond, or a C3 to C30 alicyclic organic group comprising a carbon-carbon double bond;
- $R^2$ is hydrogen, a substituted or unsubstituted C1 to C30 straight or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C30 alkoxy group, a hydroxy group, —NH$_2$, a substituted or unsubstituted C1 to C30 amine group of formula —NRR' wherein R and R' are the same or different, and are each independently hydrogen or a C1 to C30 alkyl group, an isocyanate group, a halogen, —ROR' wherein R is a substituted or unsubstituted C1 to C20 alkylene group and R' is hydrogen or a C1 to C20 straight or branched alkyl group, an acyl halide of formula —RC(=O)X wherein R is a substituted or unsubstituted alkylene group and X is a halogen, —C(=O)OR' wherein R' is hydrogen or a C1 to C20 straight or branched alkyl group, —CN, or —C(=O)ONRR' wherein R and R' are the same or different, and are each independently hydrogen or a C1 to C20 straight or branched alkyl group;
- $L_2$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, a substituted or unsubstituted C6 to C30 heterocycloalkylene group, or a combination thereof;
- $Y_2$ is a single bond, a substituted or unsubstituted C1 to C30 alkylene group, or a substituted or unsubstituted C2 to C30 alkenylene group; or a C2 to C30 alkylene group or a C3 to C30 alkenylene group wherein at least one methylene group is replaced by a sulfonyl (—SO$_2$—), a carbonyl (—C(=O)—), an ether (—O—), a sulfide (—S—), a sulfoxide (—SO—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;
- n is an integer of 1 or more;
- k3 is an integer of 0 or 1 or more;
- k4 is an integer of 1 or more;
- the sum of n and k4 is an integer of 3 or more;
- n does not exceed the valance of $Y_2$ when $Y_2$ is not a single bond; and
- k3 and k4 does not exceed the valence of the $L_2$.

13. The quantum dot polymer composite of claim 11, wherein the dithiocarbamate salt is represented by Chemical Formula 5:

$M[SCSNR_2]_n$    Chemical Formula 5 where M is a polyvalent metal comprising Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is at least two and represents the valency of the polyvalent metal, R is the same or different and each independently hydrogen, a substituted or unsubstituted C1 to C10 alkyl, a substituted or unsubstituted C3 to C20 cycloalkyl group, a substituted or unsubstituted C6 to C20 aryl group, or a combination thereof.

14. The quantum dot polymer composite of claim 11, wherein an amount of the additive moiety is greater than or equal to about 0.001 wt % to about 40 wt % based on a total weight of the composite.

15. The quantum dot polymer composite of claim 11, wherein the quantum dot polymer composite is in a form of a film.

16. The quantum dot polymer composite of claim 11, wherein the quantum dot polymer composite is in a form of a population of particles having an average particle size of less than or equal to about 10 micrometers.

17. A photosensitive composition comprising:
a quantum dot polymer composite of claim 11;
a carboxylic acid group containing polymer;
a photopolymerizable monomer; and
a photoinitiator.

18. The photosensitive composition of claim 17, wherein the carboxylic acid group containing polymer has an acid value of greater than or equal to about 50 milligrams of KOH per gram of the polymer and less than or equal to about 250 milligrams of KOH per gram of the polymer.

19. An electronic device comprising the quantum dot polymer composite of claim 11.

20. The quantum dot polymer composite of claim 11, wherein the polymer matrix comprises a crosslinked structure between the additive moiety and the first monomer, the second monomer, or a combination thereof.

* * * * *